(12) United States Patent
Takaya et al.

(10) Patent No.: US 10,249,352 B2
(45) Date of Patent: Apr. 2, 2019

(54) MEMORY DEVICE AND MEMORY SYSTEM

(71) Applicant: Toshiba Memory Corporation, Minato-ku (JP)

(72) Inventors: Satoshi Takaya, Kawasaki (JP); Hiroki Noguchi, Yokohama (JP); Shinobu Fujita, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/701,516

(22) Filed: Sep. 12, 2017

(65) Prior Publication Data

US 2018/0277177 A1    Sep. 27, 2018

(30) Foreign Application Priority Data

Mar. 22, 2017   (JP) ................. 2017-056070

(51) Int. Cl.
| G11C 7/06 | (2006.01) |
| G11C 7/08 | (2006.01) |
| G11C 7/22 | (2006.01) |
| G11C 7/10 | (2006.01) |
| G11C 13/00 | (2006.01) |
| G11C 7/02 | (2006.01) |
| G11C 11/16 | (2006.01) |
| G11C 27/02 | (2006.01) |

(52) U.S. Cl.
CPC ............. *G11C 7/1051* (2013.01); *G11C 7/02* (2013.01); *G11C 7/1069* (2013.01); *G11C 11/1673* (2013.01); *G11C 11/1693* (2013.01); *G11C 13/00* (2013.01); *G11C 13/004* (2013.01); *G11C 13/0061* (2013.01); *G11C 27/024* (2013.01); *G11C 27/026* (2013.01)

(58) Field of Classification Search
CPC .......... G11C 7/1051; G11C 7/02; G11C 13/00
USPC .................................................... 365/189.15
See application file for complete search history.

(56) References Cited

U.S. PATENT DOCUMENTS

| 6,151,260 | A | * | 11/2000 | Birk | .................... | G11C 11/4091 |
| | | | | | | 365/185.24 |
| 6,512,399 | B1 | * | 1/2003 | DeGeronimo | ....... | G11C 27/026 |
| | | | | | | 327/59 |
| 6,738,303 | B1 | | 5/2004 | Subramanian et al. |
| 9,330,756 | B2 | | 5/2016 | Bedeschi |
| 2003/0198096 | A1 | | 10/2003 | Kunikiyo |

(Continued)

FOREIGN PATENT DOCUMENTS

| JP | 60-145722 A | 8/1985 |
| JP | 2003-303942 A | 10/2003 |

(Continued)

*Primary Examiner* — Ly D Pham
(74) *Attorney, Agent, or Firm* — Oblon, McClelland, Maier & Neustadt, L.L.P.

(57) ABSTRACT

According to one embodiment, a memory device includes: a memory cell; a read driver configured to supply a read pulse to the memory cell at the time of a read operation for the memory cell; a filter circuit configured to output a second signal in a first frequency domain from a first signal, the first signal being outputted from the memory cell by the read pulse; a hold circuit configured to hold a peak value of the second signal; and a sense amplifier circuit configured to read data from the memory cell based on the peak value.

30 Claims, 10 Drawing Sheets

(56) References Cited

U.S. PATENT DOCUMENTS

| | | | |
|---|---|---|---|
| 2005/0207234 A1* | 9/2005 | Baechtold | G11C 29/48 365/189.05 |
| 2007/0121377 A1 | 5/2007 | Kajiyama | |
| 2007/0280021 A1 | 12/2007 | Ueda et al. | |
| 2010/0085794 A1 | 4/2010 | Chen et al. | |
| 2011/0286260 A1* | 11/2011 | Tsukamoto | G11C 5/147 365/148 |
| 2013/0182497 A1 | 7/2013 | Wada | |
| 2016/0085466 A1 | 3/2016 | Benedict et al. | |
| 2016/0196873 A1 | 7/2016 | Noguchi et al. | |

FOREIGN PATENT DOCUMENTS

| | | |
|---|---|---|
| JP | 2007-141399 A | 6/2007 |
| JP | 2007-323706 A | 12/2007 |
| JP | 5390620 B2 | 1/2014 |
| JP | 5698651 B2 | 4/2015 |
| JP | 2015-185179 A | 10/2015 |
| JP | 2018-92695 A | 6/2018 |

\* cited by examiner

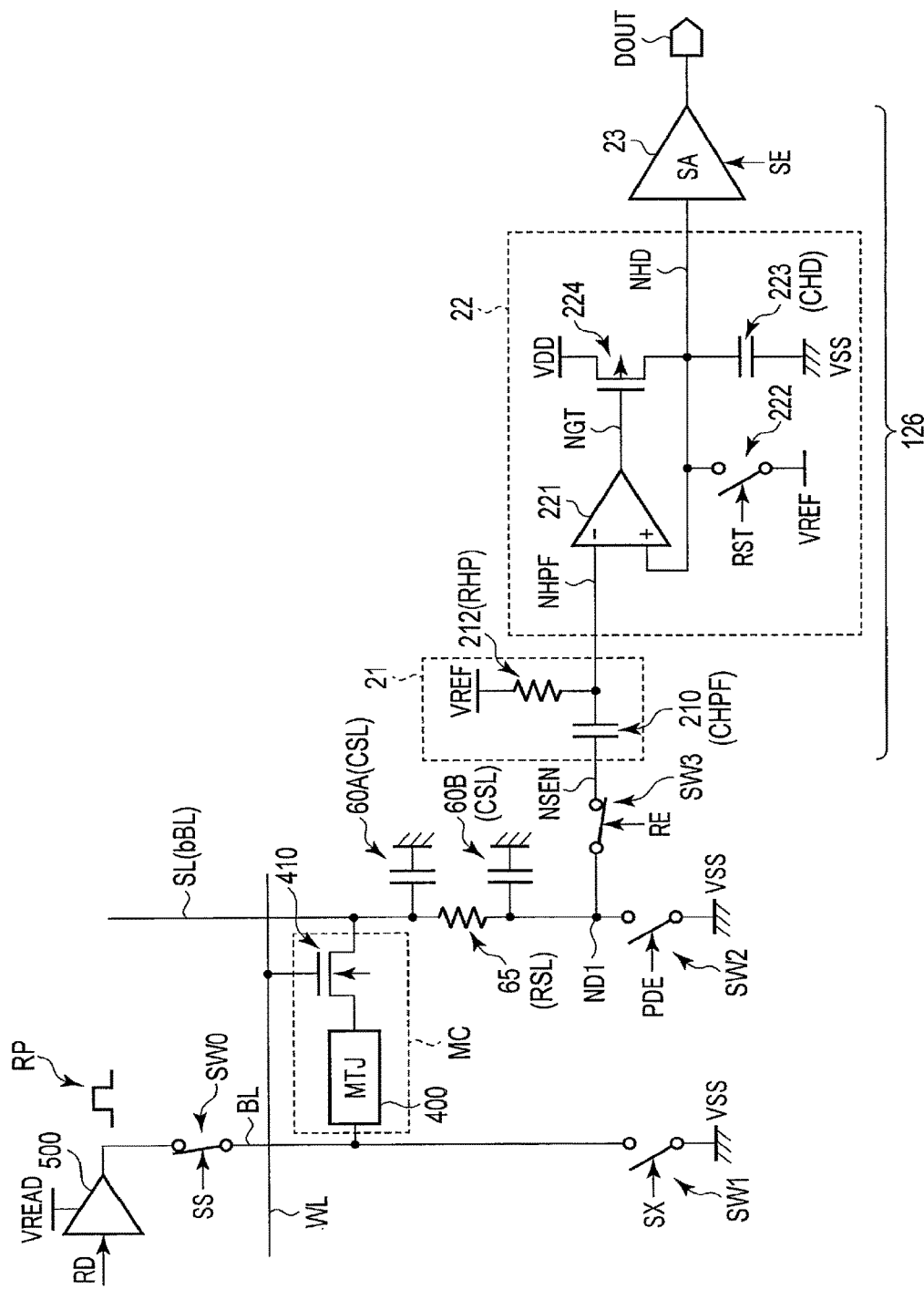
F I G. 7

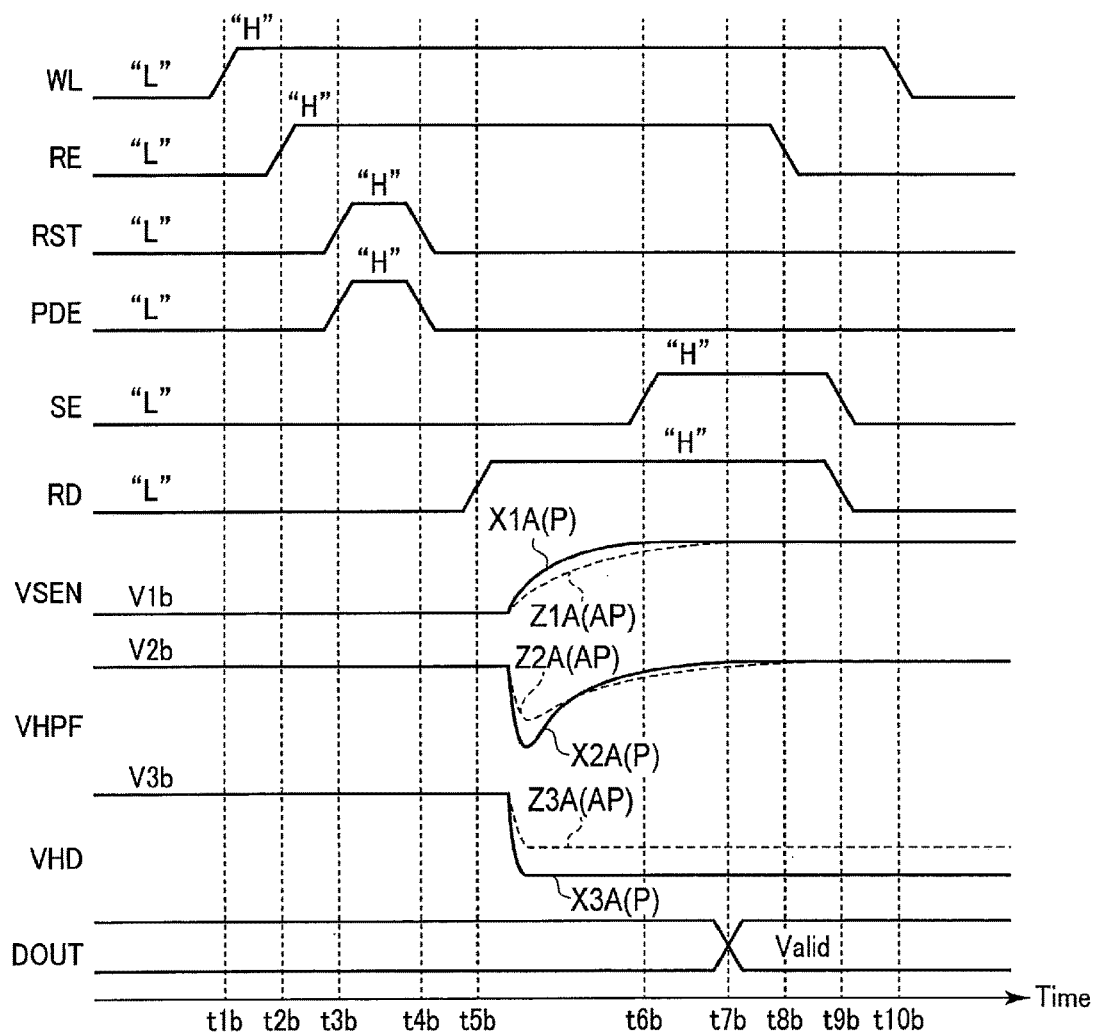
F I G. 10

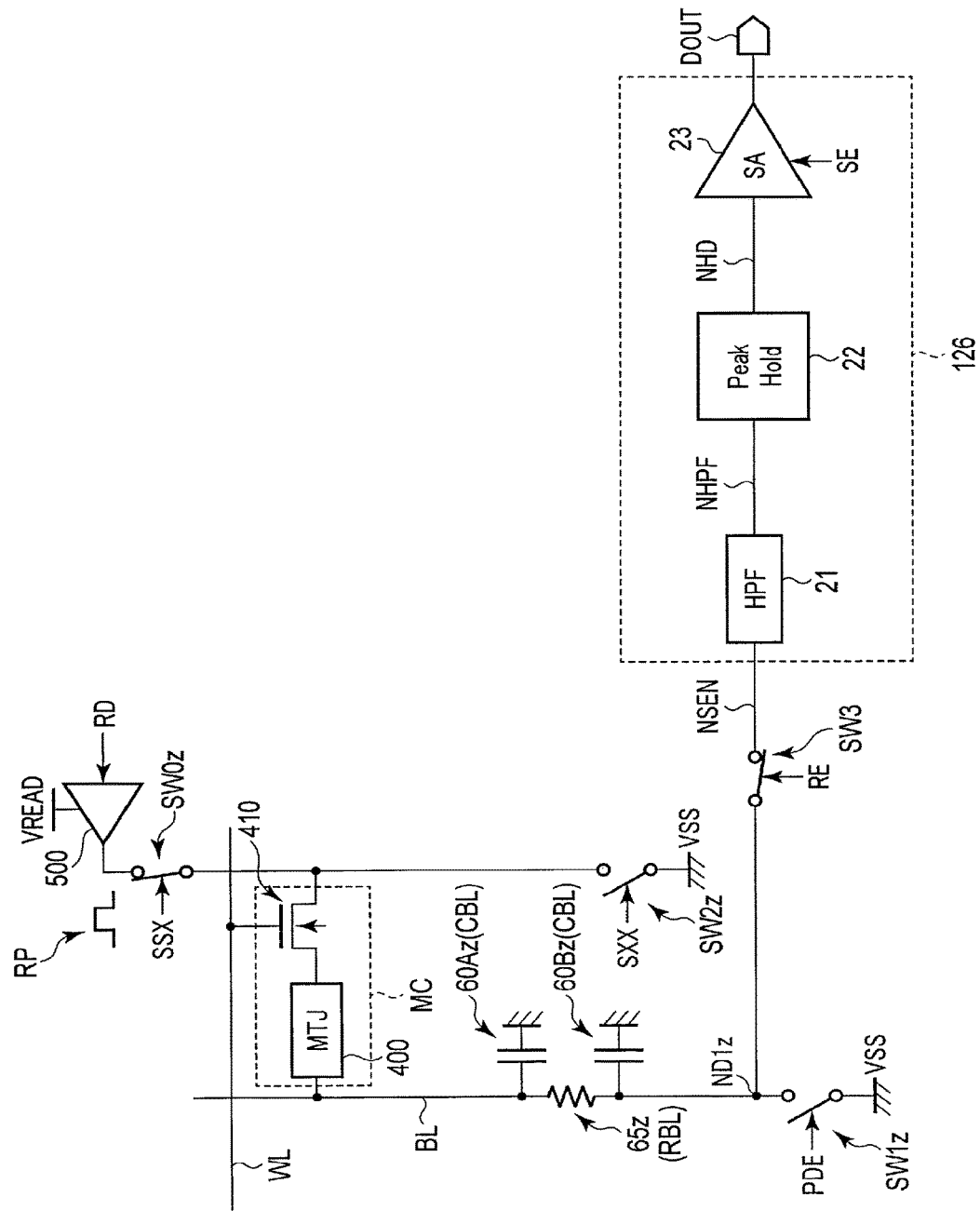
F I G. 11

US 10,249,352 B2

MEMORY DEVICE AND MEMORY SYSTEM

CROSS-REFERENCE TO RELATED APPLICATIONS

This application is based upon and claims the benefit of priority from Japanese Patent Application No. 2017-056070, filed Mar. 22, 2017, the entire contents of which are incorporated herein by reference.

FIELD

Embodiments described herein relate generally to a memory device and a memory system.

BACKGROUND

In recent years, it is proposed to use, for a main memory and cache memory, a resistance change type memory as a memory device substituted for a volatile memory (for example, a DRAM or SRAM).

With respect to the read operation of the resistance change type memory, it is required to execute a high-speed operation and reduce a read error.

BRIEF DESCRIPTION OF THE DRAWINGS

FIG. 7 is a circuit diagram showing an example of the configuration of a memory device according to the first embodiment;

FIG. 10 is a timing chart showing an example of the operation of the memory device according to the second embodiment; and FIG. 11 is a circuit diagram showing a modification of the memory device according to the embodiment.

DETAILED DESCRIPTION

Figure 1:
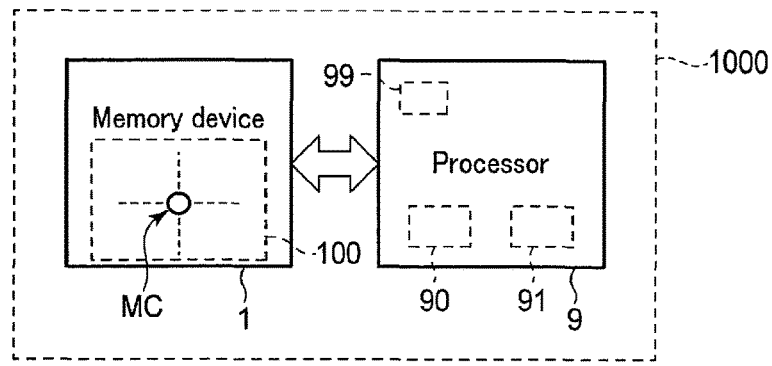
FIG. 1 is a block diagram showing an example of the configuration of a memory system including a memory device according to an embodiment.

In general, according to one embodiment, a memory device includes: a memory cell; a read driver configured to supply a read pulse to the a memory cell at the time of a read operation for the memory cell; a filter circuit configured to output a second signal in a first frequency domain from a first signal, the first signal being outputted from the memory cell by the read pulse; a hold circuit configured to hold a peak value of the second signal; and a sense amplifier circuit configured to read data from the memory cell based on the peak value.

Embodiments

A memory device according to each embodiment will be described with reference to FIGS. 1, 2, 3, 4, 5, 6, 7, 8, 9, 10, and 11.

In the following description, the same reference numerals denote elements having the same functions and configurations. In the following embodiments, when constituent elements (for example, word lines WL, bit lines BL, various voltages and signals, and the like) denoted by reference numerals having numbers/alphabets as suffixes to be distinguished are not distinguished, reference numeral obtained by omitting these numbers/alphabets as the suffixes are used.

[A] Basic Form

The basic form of a memory device according to an embodiment will be described with reference to FIGS. 1, 2, 3, 4, 5, and 6.

(1) Configuration

The basic form of the memory device according to the embodiment will be explained with reference to FIGS. 1, 2, 3, 4, and 5.

<Overall Configuration>

FIG. 1 is a schematic view for explaining an example of the configuration of the memory device according to this embodiment.

As shown in FIG. 1, a memory device 1 according to this embodiment is provided in a memory system.

The memory system includes the memory device 1 and a processor 9.

The processor 9 executes calculation processing.

For example, the processor 9 includes a memory controller 90, a CPU (calculation circuit) 91, and an internal memory 99.

The memory controller 90 causes the memory device 1 to execute various instructions (requests). For example, in response to a request from the processor 9, the memory controller 90 instructs the memory device 1 to write data. In response to a request from the processor 9, the memory controller 90 instructs the memory device 1 to read data from the memory device 1.

The CPU 91 executes various calculation processes. For example, the CPU 91 transfers, to the memory controller 90, the result of given calculation processing or part of a program as data to be written in the memory device 1. The CPU 91 executes calculation processing using data read from the memory device 1.

The internal memory 99 holds various kinds of information such as the management table and access history of the memory device 1. The internal memory 99 can temporarily hold data transferred between the memory controller 90 and the memory device 1. The internal memory 99 can temporarily hold data and a program to be used for calculation processing, the result of the calculation processing, and the like.

The memory device 1 includes a memory area for holding data. The memory area includes a memory cell array 100. A plurality of memory cells MC are provided in the memory cell array 100.

The memory device 1 executes various operations such as a data write operation and a data read operation based on instructions from the processor 9 (memory controller 90).

<Internal Configuration of Memory Device>

Figure 2:
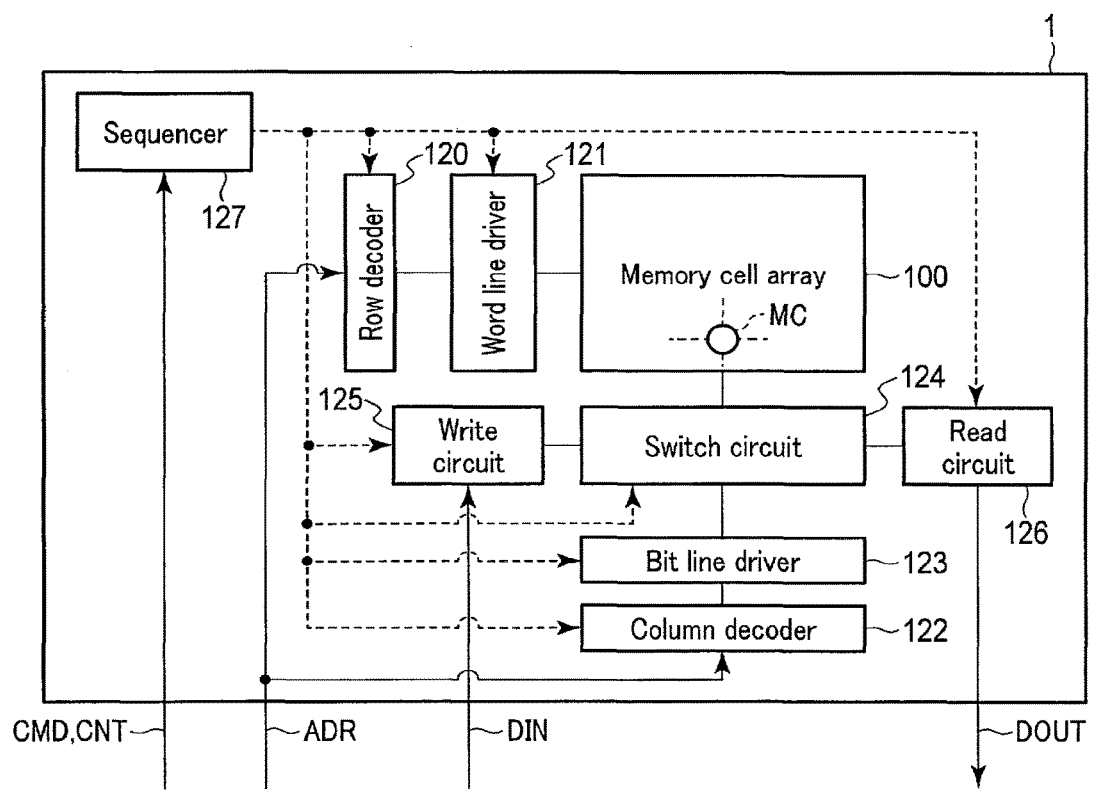
FIG. 2 is a block diagram showing an example of the configuration of the memory device according to the embodiment.

The internal configuration of the memory device according to this embodiment will be described with reference to FIG. 2.

The memory device 1 receives a command CMD, an address ADR, input data DIN, and various control signals CNT from the processor 9. The memory device 1 sends output data DOUT to the memory controller 90 or the processor 9.

The memory device 1 includes at least the memory cell array 100, a row decoder 120, a word line driver (row control circuit) 121, a column decoder 122, a bit line driver (column control circuit) 123, a switch circuit 124, a write circuit (write control circuit) 125, a read circuit (read control circuit) 126, and a sequencer 127.

The memory cell array 100 includes the plurality of memory cells MC.

The row decoder 120 decodes a row address included in the address ADR.

The word line driver 121 selects a row (for example, a word line) of the memory cell array 100 based on the decoding result of the row address. The word line driver 121 can supply a predetermined voltage to the word line.

The column decoder 122 decodes a column address included in the address ADR.

The bit line driver 123 selects a column (for example, a bit line) of the memory cell array 100 based on the decoding result of the column address. The bit line driver 123 is connected to the memory cell array 100 via the switch circuit 124. The bit line driver 123 can supply a predetermined voltage to the bit line.

The switch circuit 124 connects one of the write circuit 125 and the read circuit 126 to the memory cell array 100 and the bit line driver 123. This causes the MRAM 1 to execute an operation corresponding to the command.

At the time of a write operation, the write circuit 125 supplies, to the cell selected based on the address ADR, various voltages and currents for writing data. For example, the data DIN is supplied to the switch circuit 124 as data to be written in the memory cell array 100. This causes the write circuit 125 to write the data DIN in the memory cell MC. The write circuit 125 includes, for example, a write driver/sinker.

At the time of a read operation, the read circuit 126 supplies, to the memory cell (selected cell) selected based on the address ADR, various voltages or currents for reading data. This reads data stored in the memory cell MC.

The read circuit 126 outputs, to the outside of the resistance change type memory 1, as the output data DOUT, the data read from the memory cell array 100.

The read circuit 126 includes, for example, a read driver and a sense amplifier circuit. The read circuit 126 will be described in detail later.

The sequencer 127 receives the command CMD and the various control signals CNT. The sequencer 127 controls the operations of the respective circuits 120 to 126 in the memory device 1 based on the command CMD and the control signals CNT. In accordance with the operation status in the memory device 1, the sequencer 127 can transmit the control signals CNT to the memory controller 90.

For example, the sequencer 127 holds, as setting information, various kinds of infoLutation about the write operation and read operation.

Note that the various signals may be supplied to a predetermined circuit in the memory device 1 via an interface circuit provided separately from the chip (package) of the memory device 1, or supplied from an input/output circuit (not shown) in the memory device 1 to the respective circuits 120 to 127.

For example, the memory device 1 according to this embodiment is a resistance change type memory. The resistance change type memory 1 uses a variable resistance element (resistance change type memory element) as a memory element in the memory cell MC.

<Internal Configuration of Memory Cell Array>

Figure 3:
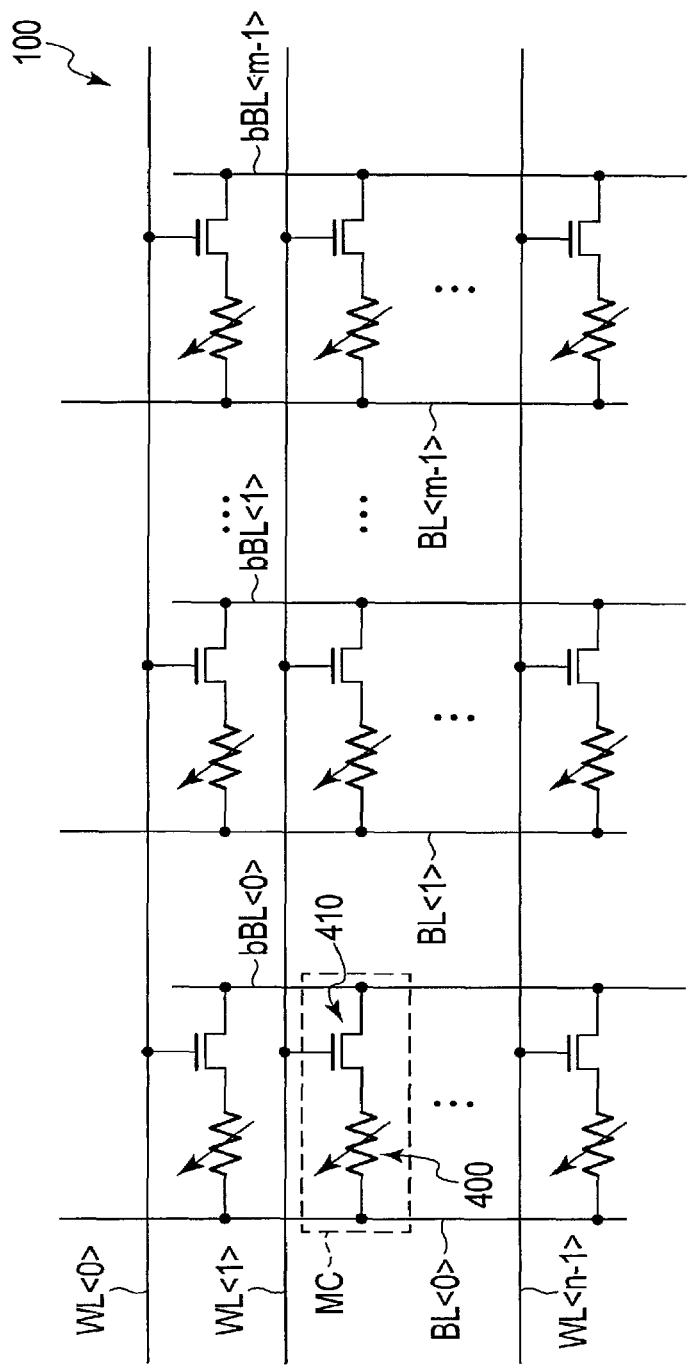
FIG. 3 is an equivalent circuit diagram showing an example of the configuration of the memory device according to the embodiment.

FIG. 3 is an equivalent circuit diagram showing an example of the internal configuration of the memory cell array of the resistance change type memory according to this embodiment.

As shown in FIG. 3, a plurality (n) of word lines WL (WL<0>, WL<1>, . . . , WL<n-1>) are provided in the memory cell array 100. A plurality (m) of bit lines BL (BL<0>, BL<1>, . . . , BL<m-1>) and a plurality (m) of bit lines bBL (bBL<0>, bBL<1>, . . . , bBL<m-1>) are provided in the memory cell array 100. One bit line BL and one bit line bBL form one bit line pair. The bit line bBL may be referred to as a source line hereinafter for the sake of descriptive clarification.

The plurality of memory cells MC are arranged in a matrix in the memory cell array 100.

The plurality of memory cells MC arrayed in the x direction (row direction) are connected to the common word line WL. The word line WL is connected to the word line driver 121. The word line driver 121 controls the potential of the word line WL based on the row address. Thereby, the word line WL (row) indicated by the row address are selected and activated.

The plurality of memory cells MC arrayed in the y direction (column direction) are commonly connected to the two bit lines EL and bBL belonging to one bit line pair.

The bit lines BL and bBL are connected to the bit line driver 123 via the switch circuit 124.

The switch circuit 124 connects the bit lines BL and bBL corresponding to the column address to the bit line driver 123. The bit line driver 123 controls the potentials of the bit lines BL and bBL. Thereby, the bit lines BL and bBL (column) indicated by the column address are selected and activated.

The switch circuit 124 connects the selected bit lines BL and bBL to the write circuit 125 or the read circuit 126 in accordance with an operation requested for the memory cell MC.

For example, each memory cell MC includes one variable resistance element 400 and one cell transistor 410. The variable resistance element 400 functions as a memory element. The cell transistor 410 functions as the selection element of the memory cell MC.

One end of the variable resistance element 400 is connected to the bit line BL. The other end of the variable resistance element 400 is connected to one end (one of the source/drain) of the cell transistor 410. The other end (the other one of the source/drain) of the cell transistor 410 is connected to the bit line bBL. The word line WL is connected to the gate of the cell transistor 410.

Each memory cell MC may include two or more variable resistance elements 400, and include two or more cell transistors 410.

The memory cell array 100 may have a hierarchical bit line structure. In this case, a plurality of global bit lines are provided in the memory cell array 100. Each bit line BL is connected to one global bit line via a corresponding switch element. Each source line bBL is connected to the other global bit line via a corresponding switch element. The global bit lines are connected to the write circuit 125 and the read circuit 126 via the switch circuit 124.

The resistance state of the variable resistance element 400 changes when a voltage or current of a given magnitude is supplied to the variable resistance element 400. This allows the variable resistance element 400 to take a plurality of resistance states (resistance values). Data of one or more bits are associated with the plurality of resistance states that can be taken by the variable resistance element 400. In this way, the variable resistance element 400 is used as a memory element.

Whether the resistance state of the variable resistance element 400 changes by supply of a voltage or current depends on the type or characteristic of the variable resistance element 400.

In this embodiment, the resistance change type memory 1 is, for example, an MRAM (Magnetoresistive Random Access Memory). In the MRAM 1, a magnetoresistive effect element is used as the variable resistance element (memory element) 400.

<Basic Operation of Memory Element>

The operation principle of the magnetoresistive effect element as a memory element will be described with reference to FIG. 4.

Figure 4:
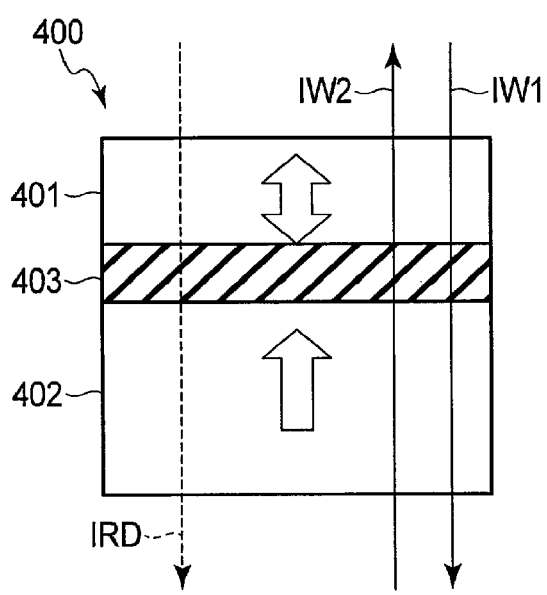
FIG. 4 is a view showing an example of the memory element of the memory device according to the embodiment.

As shown in FIG. 4, the magnetoresistive effect element 400 includes at least two magnetic layers 401 and 402 and a nonmagnetic layer 403.

Each of the two magnetic layers 401 and 402 has magnetization. The magnetization direction of the magnetic layer 401 is variable. The magnetization direction of the magnetic layer 402 is invariable (fixed state).

In this embodiment, the magnetic layer 401 in which the magnetization direction is variable will be referred to as the storage layer 401 hereinafter, and the magnetic layer 402 in which the magnetization direction is invariable will be referred to as the reference layer 402 hereinafter.

Note that in this embodiment, the fact that the magnetization direction of the reference layer is invariable means that if a current or voltage for changing the magnetization direction of the storage layer is supplied, the magnetization direction of the reference layer remains unchanged by the supplied current or voltage.

The nonmagnetic layer 403 is provided between the two magnetic layers 401 and 402. The nonmagnetic layer 403 functions as the tunnel barrier layer 403. For example, the tunnel barrier layer 403 is an insulating layer containing magnesium oxide.

For example, the two magnetic layers 401 and 402 and the tunnel barrier layer 403 form a magnetic tunnel junction. In this embodiment, the magnetoresistive effect element 400 including the magnetic tunnel junction will be referred to as the MTJ element 400 hereinafter.

For example, the magnetic layers 401 and 402 have perpendicular magnetic anisotropies. The magnetization directions (easy axes of magnetization) of the magnetic layers 401 and 402 are substantially perpendicular to their layer surfaces. The magnetization directions of the magnetic layers 401 and 402 are substantially parallel to the stacking direction of the plurality of layers 401, 402, and 403. The perpendicular magnetic anisotropies of the magnetic layers 401 and 402 are generated using the interface magnetic anisotropies of the magnetic layers and the like. The MTJ element using the perpendicular magnetic anisotropies of the magnetic layers is called a perpendicular magnetization type MTJ element.

The resistance state of the MTJ element (magnetoresistive effect element) 400 changes in accordance with the relative relationship (magnetization alignment) between the magnetization direction of the storage layer 401 and that of the reference layer 402.

If the magnetization direction of the storage layer 401 is the same as that of the reference layer 402, the MTJ element 400 has the first resistance state (first magnetization alignment state).

If the magnetization direction of the storage layer 401 is opposite to that of the reference layer 402, the MTJ element 400 has the second resistance state (second magnetization alignment state). A resistance value Rap of the MTJ element 400 having the second resistance state is higher than a resistance value Rp of the MTJ element 400 having the first resistance state.

As described above, the MTJ element 400 can take one of the low-resistance state and the high-resistance state in accordance with the magnetization alignment of the two magnetic layers 401 and 402.

For example the MTJ element 400 holds 1-bit data ("0" data and "1" data). In this case, when the resistance state of the MTJ element 400 is set to the first resistance state, the memory cell MC is set in the first data holding state (for example, the "0" data holding state). When the resistance state of the MTJ element 400 is set to the second resistance state, the memory cell MC is set in the second data holding state (for example, the "1" data holding state).

In this embodiment, the magnetization alignment state in which the magnetization direction of the storage layer 401 is the same as that of the reference layer 402 in the MTJ element 400 will be referred to as a parallel state (or P state) hereinafter. The magnetization alignment state in which the magnetization direction of the storage layer 401 is opposite to that of the reference layer 402 in the MTJ element 400 will be referred to as an anti-parallel state (or AP state) hereinafter.

For example, data is written in the MTJ element 400 using a spin transfer magnetization switching method. The spin transfer magnetization switching method is a write method of controlling the magnetization direction of the storage layer 401 by spin torque generated when a write current IW1 or IW2 flows in the MTJ element 400.

If the magnetization alignment state of the MTJ element 400 is changed from the AP state to the P state, the write current IW1 flowing from the storage layer 401 to the reference layer 402 is supplied to the MTJ element 400.

In this case, the spin torque of electrons having a spin in the same direction as the magnetization direction of the reference layer 402 is applied to the magnetization of the storage layer 401.

If the magnetization direction of the storage layer 401 is opposite to that of the reference layer 402, the magnetization direction of the storage layer 401 is set to the same direction as the magnetization direction of the reference layer 402 by the applied spin torque.

As a result, the MTJ element 400 is set in the P state. In this way, "0" data is written in the memory cell MC.

Note that if the write current IW1 is supplied to the MTJ element 400 in the P state, the magnetization direction of the storage layer 401 remains unchanged. Therefore, the MTJ element 400 is maintained in the P state.

If the magnetization alignment state of the MTJ element 400 is changed from the P state to the AP state, the write current IW2 flowing from the reference layer 402 to the storage layer 401 is supplied to the MTJ element 400.

In this case, the spin torque of electrons having a spin in a direction opposite to the magnetization direction of the reference layer 402 is applied to the magnetization of the storage layer 401.

If the magnetization direction of the storage layer 401 is the same as that of the reference layer 402, the magnetization direction of the storage layer 401 is set to the direction opposite to the magnetization direction of the reference layer 402 by the applied spin torque.

As a result, the MTJ element 400 is set in the AP state. In this way, "1" data is written in the memory cell MC.

Note that if the write current IW2 is supplied to the MTJ element 400 in the AP state, the magnetization direction of the storage layer 401 remains unchanged. Therefore, the MTJ element 400 is maintained in the AP state.

When reading data from the MTJ element 400 (determining the resistance state of the MTJ element 400), a read current IRD flows in the MTJ element 400. The current value of the read current IRD is smaller than the magnetization switching threshold value of the storage layer 401.

A data read operation is executed based on a sense result such as the current value of the read current IRD, a fluctuation in potential of a given node caused by the read current IRD, or the accumulation amount of charges by the read current IRD.

For example, the current value of the read current IRD output from the MTJ element 400 in the high-resistance state (AP state) is smaller than that of the read current IRD output from the MTJ element 400 in the low-resistance state (P state).

Based on a fluctuation in the current IRD along with a difference in the resistance state of the MTJ element 400, data held in the MTJ element 400 is determined.

<Example of Configuration of Read Circuit>

Figure 5:
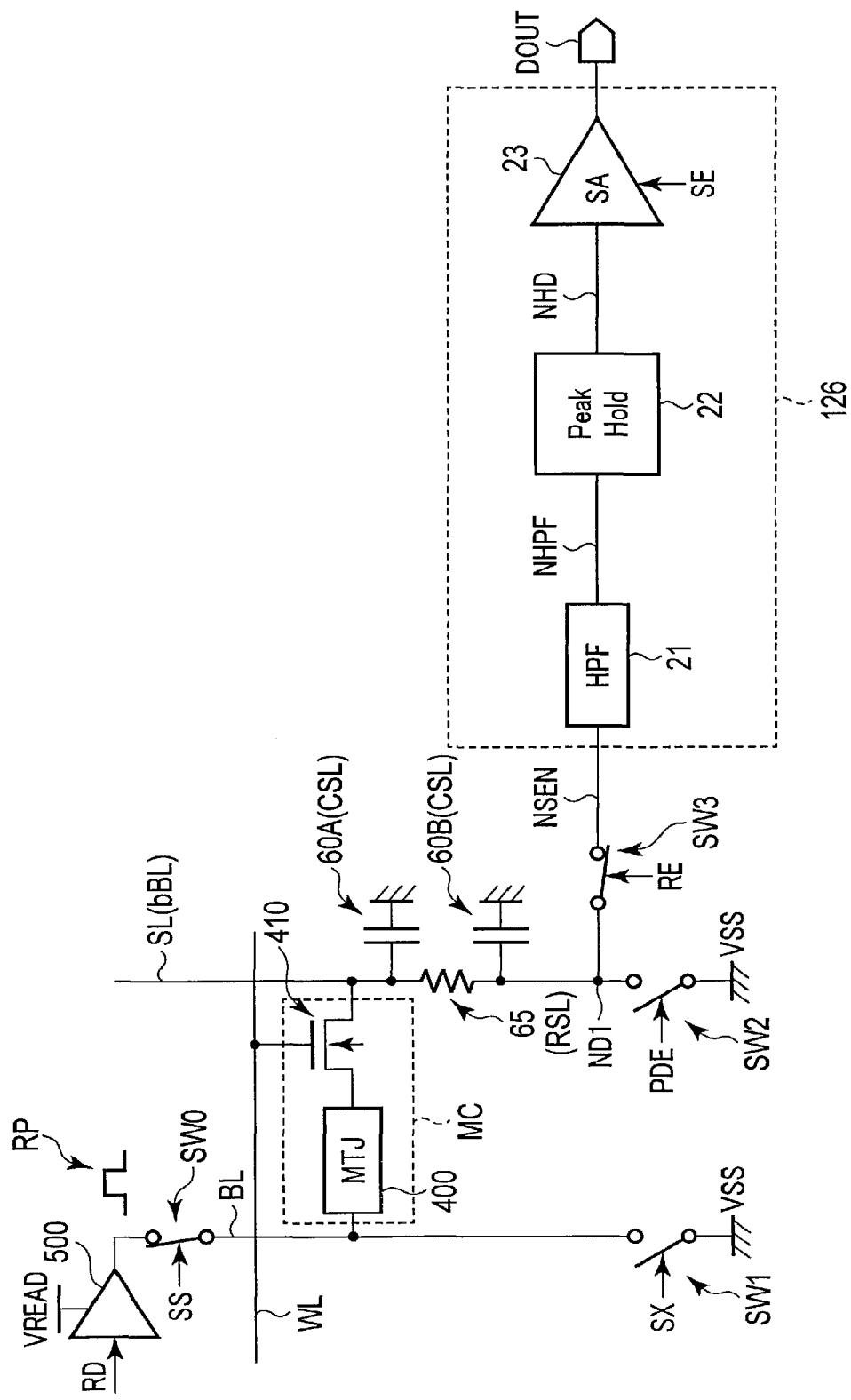
FIG. 5 is a circuit diagram showing an example of the basic configuration of the memory device according to the embodiment.

FIG. 5 is a circuit diagram for explaining the basic configuration of the read circuit in the MRAM according to this embodiment.

FIG. 5 appropriately shows other circuits used at the time of data read in addition to the read circuit 126. FIG. 5 shows a memory cell (to be referred to as a selected cell hereinafter) as an operation target extracted from the plurality of memory cells MC in the memory cell array 100 for the sake of simplicity.

As shown in FIG. 5, at the time of data read, a read driver 500 is connected to the bit line BL via a switch element SW0. A voltage VREAD is supplied to the read driver 500 as a driving voltage (power supply voltage).

At the time of data read, the read driver 500 supplies a read pulse RP to the bit line BL in accordance with a control signal RD. In accordance with a data read method applied to a read operation, the read pulse RP may be a current pulse or a voltage pulse. The read pulse RP is, for example, a square wave (rectangular voltage pulse or current pulse).

Note that the read driver 500 may be a component in the bit line driver 123 or a component of the read circuit 126.

The switch element SW0 controls electrical connection between the bit line BL and the read driver 500. A control signal SS is used to control ON/OFF of the switch element SW0. The switch element SW0 is set in an ON state based on a selected address at the time of the read operation.

For example, a switch element SW1 is connected to the bit line BL. A switch element SW2 is connected to a source line SL. The switch element SW1 or SW2 controls connection between the bit line BL or source line SL and a terminal (interconnect) to which a ground voltage VSS is applied. The terminal to which the ground voltage VSS is applied will be referred to as a ground terminal VSS hereinafter.

A control signal SX is used to control ON/OFF of the switch element SW1. A control signal (to be also referred to as, for example, a pre-discharge enable signal hereinafter) PDE is used to control ON/OFF of the switch element SW2.

The switch elements SW1 and SW2 are set in an ON or OFF state in accordance with control of charge/discharge of the bit line BL and source line SL, respectively.

Note that the switch elements SW0, SW1, and SW2 may be components of the read circuit 126 or components of the switch circuit 124.

For example, capacitances 60A and 60B and a resistance 65 are connected to the source line SL.

One end of each of the capacitances 60A and 60B is connected to the source line SL. The other end of each of the capacitances 60A and 60B is connected to the ground terminal VSS. The capacitance 60A has a capacitance value CSL. The capacitance 60B has the capacitance value CSL.

One end of the resistance 65 is connected to one end of the capacitance 60A. The other end of the resistance 65 is connected to the other end of the capacitance 60B. The resistance 65 has a resistance value RSL. For example, the capacitances 60A and 60B are capacitance components (parasitic capacitances) included in the source line SL. The resistance 65 is a resistance component (parasitic resistance) included in the source line SL. Note that FIG. 5 shows only the parasitic components of the source line SL but the bit line BL also includes a resistance component and capacitance components.

For example, charges generated by an output (voltage or current) from the selected cell are accumulated in the capacitances 60A and 60B. The charge waveform of the source line SL is supplied to the read circuit 126 as the output signal of the selected cell.

A switch element SW3 is connected between the read circuit 126 and the source line SL. One end of the switch element SW3 is connected to a node ND1 of the source line SL. The other end of the switch element SW3 is connected to the input terminal (a node NSEN) of the read circuit 126. A control signal (to be also referred to as, for example, a read enable signal hereinafter) RE is used to control ON/OFF of the switch element SW3. Electrical connection between the read circuit 126 and the source line SL is controlled by ON/OFF of the switch element SW3.

The switch element SW3 may be a component of the read circuit 126 or a component of the switch circuit 124.

The read circuit 126 is connected to the source line SL via the switch element SW3.

In the MRAM according to this embodiment, the read circuit 126 includes a filter circuit 21, a hold circuit (sampling circuit) 22, and a sense amplifier circuit 23.

The input terminal of the filter circuit 21 is connected to the node ND1 of the source line SL via the node NSEN and the switch element SW3. The output terminal of the filter circuit 21 is connected to the input terminal of the peak hold circuit 22 via a node NHPF.

The output terminal of the hold circuit 22 is connected to the input terminal of the sense amplifier circuit 23 via a node NHD.

The output terminal of the sense amplifier circuit 23 is connected to a terminal for outputting the data DOUT. The output terminal of the data DOUT will also be referred to as a data output terminal DOUT hereinafter.

A control signal (to be also referred to as, for example, a sense enable signal hereinafter) SE is supplied to the control terminal of the sense amplifier circuit 23. The control signal SE is used to control the operation of the sense amplifier circuit 23.

The filter circuit 21 extracts a signal of a given frequency component from the output signal of the selected cell MC output to the source line SL (or a signal generated from the output signal of the selected cell MC).

For example, the filter circuit 21 serves as a high-pass filter. In this case, the filter circuit 21 passes a high-frequency component of the supplied signal. The signal having passed through the filter circuit 21 is supplied to a circuit of a succeeding stage (in this example, the hold circuit 22).

The filter circuit 21 serving as a high-pass filter will also be referred to as the high-pass filter circuit 21 hereinafter. The output signal of the memory cell MC and a signal on the interconnect (node) on which the output signal of the memory cell MC is reflected will also be referred to as cell signals hereinafter.

The hold circuit 22 samples the output signal of the filter circuit 21, and holds a sampled value. The hold circuit 22 detects the maximum value (or minimum value) of the output signal of the filter circuit 21 during a period (sampling period) for sampling the signal, and holds the detected value (sampled value). The hold circuit 22 outputs the detected maximum value (or minimum value) to the sense amplifier circuit 23.

In this embodiment, the hold circuit 22 will also be referred to as the peak hold circuit 22 hereinafter.

The sense amplifier circuit 23 determines data in the selected cell MC based on the output signal of the hold circuit 22. The output signal of the sense amplifier circuit 23 is output as the data in the selected cell MC.

Note that the internal configuration of the sense amplifier circuit 23 is changed appropriately in accordance with a read method (for example, at least one method selected from a DC method, a reference cell method, a self-reference method, and the like) applied to the MRAM 1.

For example, in a read operation adopting the DC method, the sense amplifier circuit 23 compares the output voltage of the hold circuit 22 to a given reference voltage (DC voltage). In this case, the output from the hold circuit 22 is supplied to one input terminal of the sense amplifier circuit 23, and the DC voltage is supplied to the other input terminal of the sense amplifier circuit 23.

For example, in a read operation adopting the reference cell method, the sense amplifier circuit 23 compares the output voltage of the hold circuit 22 to that of the reference cell. In this case, the output from the hold circuit 22 is supplied to one input terminal of the sense amplifier circuit 23, and the output voltage of the reference cell is supplied to the other input terminal of the sense amplifier circuit 23.

For example, in a read operation adopting the self-reference method, the sense amplifier circuit 23 compares the output voltage of the hold circuit 22 before write of given reference data in the selected cell to that after write of the given reference data in the selected cell. For example, in the sense amplifier circuit 23 of the MRAM to which the read operation adopting the self-reference method is applied, a capacitance element that holds the output voltage of the hold circuit 22 before write of the reference data is connected to one input terminal of the sense amplifier circuit 23, and a capacitance element that holds the output voltage of the hold circuit 22 after write of the reference data is connected to the other input terminal of the sense amplifier circuit 23.

(2) Operation and Effect

The operation and effect of the resistance change type memory according to this embodiment will be described with reference to FIG. 6.

At the time of the read operation of the resistance change type memory, the read driver supplies the read pulse to the bit line (or source line). The read pulse is a voltage pulse (or current pulse) approximated to a square wave.

When attention is paid to the frequency domain of the read pulse, the read pulse includes many frequency components.

The read pulse is influenced by the resistance value of the memory element and an impedance generated by the parasitic components (parasitic resistance and parasitic capacitances) of the bit line/source line in a path from the read driver to the sense amplifier circuit via the selected cell.

The components on the high-frequency domain side of the read pulse tend to attenuate due to the influence of the impedance between the read driver and the sense amplifier circuit. The attenuation of the read pulse forms the voltage waveform of the read pulse into a shape in which the corners of the square wave are obtuse (a shape in which a given angle is formed at each corner or a shape in which each corner is rounded off).

A frequency component that attenuates during propagation of the read pulse and its attenuation factor tend to largely change depending on the resistance value of the memory element included in the impedance on the signal path of the read pulse.

Thus, at the time of the read operation of the resistance change type memory, if it is possible to determine the difference between the magnitude of the high-frequency component of the read pulse in the memory element in the low-resistance state and that in the memory element in the high-resistance state based on the extracted high-frequency component of the cell signal, the resistance change type memory can execute a high accuracy read operation.

As described above, in the resistance change type memory (for example, an MRAM) according to this embodiment, the read circuit 126 includes the high-pass filter circuit 21 and the peak hold circuit 22. The high-pass filter circuit 21 and the peak hold circuit 22 are connected between the read driver 500 and the sense amplifier circuit 23.

In this embodiment, the high-pass filter circuit 21 extracts a high-frequency component of the signal from the selected cell.

The peak hold circuit 22 detects the peak value of the output signal (the high-frequency component of the cell signal) from the high-pass filter circuit 21, and holds the peak value. The peak hold circuit 22 outputs the held peak value to the sense amplifier circuit 23 as an output signal. As a result, the high-frequency component included in the cell signal is converted into a DC signal.

The sense amplifier circuit 23 determines the data in the selected cell using the signal from the peak hold circuit 22.

Figure 6:
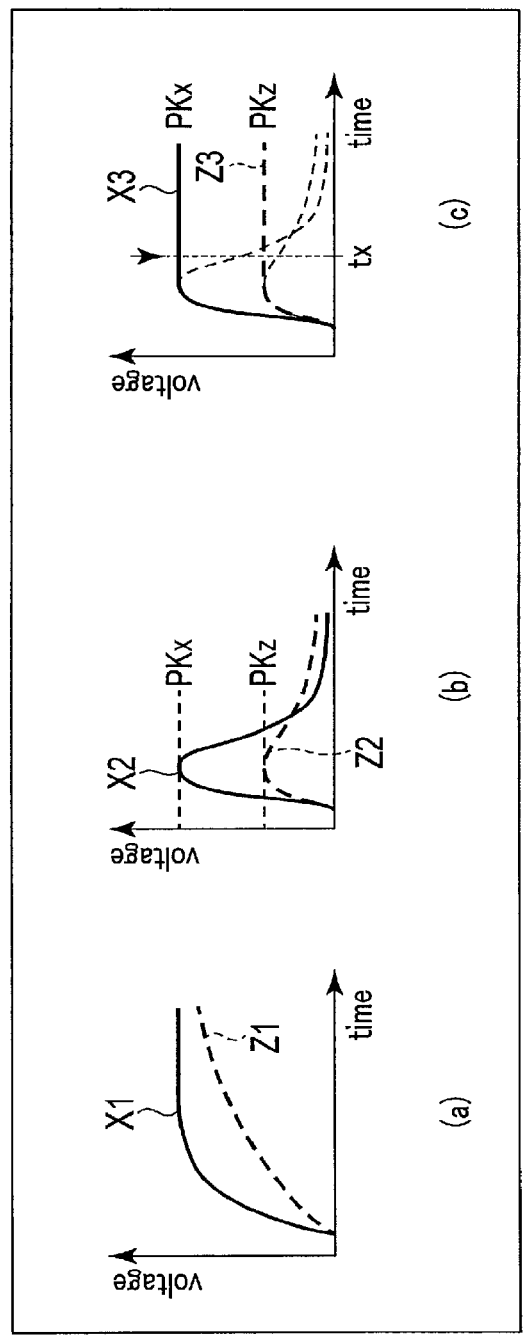
FIG. 6 is a view for explaining the basic configuration of the memory device according to the embodiment.

FIG. 6 is a view showing the state of the signal from the memory cell on the signal path in the read circuit at the time of the read operation of the resistance change type memory according to this embodiment.

Each of (a), (b), and (c) of FIG. 6 shows a temporal change in voltage value in each node of the read circuit 126. In (a), (b), and (c) of FIG. 6, the abscissa of each graph represents the time and the ordinate of each graph represents the voltage value.

In FIG. 6, (a) shows a temporal change in potential VSEN of the node NSEN to which the signal is input from the selected cell. In FIG. 6, (b) shows a temporal change in potential (the output signal of the high-pass filter circuit 21) VHPF of the node NHPF between the high-pass filter circuit 21 and the peak hold circuit 22. In FIG. 6, (c) shows a temporal change in potential (the output signal of the peak hold circuit 22) VHD of the node NHD between the peak hold circuit 22 and the sense amplifier circuit 23.

In (a), (b), and (c) of FIG. 6, lines (waveforms) X1, X2, and X3 respectively represent temporal changes in potentials of the respective nodes when the magnetization alignment state of the MTJ element 400 is the P state. Lines (waveforms) Z1, Z2, and Z3 respectively represent temporal changes in potentials of the respective nodes when the magnetization alignment state of the MTJ element 400 is the AP state.

At the time of the read operation of the MRAM according to this embodiment, the read pulse RP supplied from the read driver 500 causes the selected cell MC to output, to the source line SL, an output signal (current or potential) corresponding to the resistance state of the MTJ element. In accordance with the resistance state of the MTJ element, the selected cell outputs a signal of a waveform corresponding to the resistance value Rp of the MTJ element in the P state or a signal of a waveform corresponding to the resistance value Rap of the MTJ element in the AP state.

As shown in (a) of FIG. 6, the cell signal (the output signal from the selected cell MC or the charge potential of the source line SL) is supplied to the node NSEN.

As indicated by the lines X1 and Z1 in (a) of FIG. 6, the potential of the node NSEN changes in accordance with the magnetization alignment state (resistance state) of the MTJ element 400 in the selected cell MC.

The potential of the node NSEN when the cell signal is supplied by the MTJ element 400 in the P state (line X1) is higher than that when the cell signal is supplied by the MTJ element 400 in the AP state (line Z1).

The temporal change in potential of the node NSEN caused by the cell signal of the MTJ element 400 in the P state is sharper than that caused by the cell signal of the MTJ element 400 in the AP state.

Note that in a charge-accumulation type read method, if the output signal of the selected cell MC is supplied to the read circuit 126, charges accumulated in the capacitances 60A and 60B of the source line SL (or bit line BL) are supplied to the node NSEN. A potential corresponding to the amount of charges accumulated in the capacitances 60A and 60B of the source line SL is reflected on the potential of the node NSEN.

In the read circuit of the resistance change type memory according to this embodiment, the high-pass filter circuit 21 extracts the high-frequency component of the cell signal (for example, the charge waveforms of the bit line BL and source line SL) at the time of application of the read pulse.

When the potential VSEN of the node NSEN passes through the high-pass filter circuit 21, only a high-frequency component included in the cell signal passes. This causes the high-pass filter circuit 21 to output a signal (voltage) in a high-frequency domain higher than a given frequency.

As shown in (b) of FIG. 6, in the charge-accumulation type read method, the potential (the output waveform of the high-pass filter circuit) VHPF of the node NHPF has a hill-shaped (convex-shaped) waveform in which given portions (for example, central portions) of the lines (waveforms) X2 and Z2 are high.

For example, the potential VHPF of the node NHPF has peak values PKx and PKz of the potential of the high-frequency component included in the cell signal at time ta.

The potential (peak value) PKx of the node NHPF corresponding to the MTJ element 400 in the P state is higher than the potential (peak value) PKz of the node NHPF corresponding to the MTJ element 400 in the AP state.

The peak values PKx and PKz of the potential VHPF of the node NHPF are determined based on the magnitude of the potential of the high-frequency component in the node NSEN. The magnitudes of the resistance value of the MTJ element 400, the parasitic resistance of the bit line/source line, and the parasitic capacitances of the bit line/source line are reflected on the potential of the high-frequency component of the cell signal.

The magnitudes of the parasitic resistance and parasitic capacitances of the bit line/source line are substantially constant regardless of whether the magnetization alignment state of the MTJ element is the P state or the AP state.

Therefore, the magnitudes of the peak values PKx and PKz change depending on the resistance value (magnetization alignment state) of the MTJ element 400.

The peak hold circuit 22 detects (samples) the peak values (for example, the maximum potentials) PKx and PKz of the high-frequency component included in the signal from the selected cell in the node NHPF, and holds the peak values PKx and PKz.

As shown in (c) of FIG. 6, the peak hold circuit 22 outputs, to the sense amplifier circuit 23, as the output signal VHD, the signal in a state in which the held peak value PKx or PKz is maintained.

With this configuration, in the MRAM according to this embodiment, the read circuit 126 can convert, into a DC signal, the peak value of the high-frequency component included in the signal from the selected cell MC.

When (a) and (c) of FIG. 6 are compared with each other, the potential difference between the waveforms X3 and Z3 is larger than that between the waveforms X1 and Z1.

DC conversion of the high-frequency component of the cell signal allows the MRAM of this embodiment to make a read margin large.

The value of the high-frequency component in the cell signal after DC conversion is input to the sense amplifier circuit 23.

The sense amplifier circuit 23 senses the potential VHD of the node NHD at time tx.

The sense amplifier circuit 23 determines the data in the selected cell using the sensed potential VHD. The sense amplifier circuit 23 outputs a signal based on a determination result.

The output signal DOUT from the sense amplifier circuit 23 is transferred to the memory controller 90 (and processor 9) as the data DOUT read from the selected cell MC.

If the resistance change type memory is used as an alternative to the DRAM or SRAM, it is required to perform a high-speed read operation.

In the general resistance change type memory, a variation in resistance value of the memory element may increase a read error and decrease the speed of the read operation.

For example, based on the characteristic of the MTJ element, the MRAM has a low resistance ratio (MR ratio) between the high-resistance state of the MTJ element and the low-resistance state of the MTJ element. Manufacturing variations along with miniaturization of the element may make it difficult for the MRAM to ensure a sufficient operation margin while maintaining a high-speed operation.

In accordance with the read method applied to the read operation of the resistance change type memory, it may be difficult to control the sense timing of the signal, and the read margin may decrease due to a shift of the sense timing.

The resistance change type memory serving as the memory device according to this embodiment extracts a high-frequency component from the signal from the selected cell, and converts the signal from the selected cell into a DC signal using the peak value of the extracted high-frequency component.

When the high-frequency component of the cell signal is converted into a DC value, the resistance change type memory according to this embodiment can increase the difference between the output signal of the memory cell including the MTJ element in the P state and that of the memory cell including the MTJ element in the AP state. The resistance change type memory according to this embodiment can make a signal supplied to the sense amplifier circuit have a constant value (a value with a small fluctuation).

This allows the resistance change type memory according to this embodiment to eliminate the dependency between the sense margin and the sense timing of the signal from the selected cell in the read circuit.

Therefore, the resistance change type memory according to this embodiment can reduce the error rate of the read operation.

In the resistance change type memory according to this embodiment, a period until the potential is saturated after the peak value PKx or PKz is held is shorter than a period until fluctuations in potentials of the bit line BL and source line LS are saturated before passing through the high-pass filter circuit 21.

Therefore, the resistance change type memory according to this embodiment can set the sense timing of the signal at an earlier stage (time) while maintaining the high sense margin.

As a result, the resistance change type memory according to this embodiment can improve the speed of the read operation even if the cell signal is supplied to the sense amplifier circuit 23 via the filter circuit 21 and the hold circuit 22.

As described above, the resistance change type memory according to this embodiment can expand the read margin and reduce the error rate. The resistance change type memory according to this embodiment can also increase the speed of the read operation.

The memory device according to this embodiment can thus improve the operation characteristic.

(B) First Embodiment

A memory device according to the first embodiment will be described with reference to FIGS. 7 and 8.

(1) Configuration Example

An example of the configuration of the memory device according to this embodiment will be described with reference to FIG. 7.

FIG. 7 is a schematic circuit diagram for explaining the internal configuration of a read circuit in the memory device (for example, a resistance change type memory such as an MRAM) according to this embodiment.

As shown in FIG. 7, a high-pass filter circuit 21 is provided between nodes NSEN and NHPF. The input terminal of the high-pass filter circuit 21 is connected to the node NSEN. The output terminal of the high-pass filter circuit 21 is connected to the node NHPF.

The high-pass filter circuit 21 includes a capacitance element 210 and a resistance element 212.

One terminal (one end) of the capacitance element 210 is connected to a switch element SW3. The other terminal (other end) of the capacitance element 210 is connected to one terminal of the resistance element 212. The capacitance element 210 is inserted in series with the signal path between the nodes NSEN and NHPF.

One terminal of the resistance element 212 is connected to the node NHPF. The other terminal of the resistance element 212 is connected to a terminal (interconnect) to which a voltage VREF is applied. The potential of one terminal of the resistance element 212 is set to a fixed potential (voltage VREF). The terminal to which the voltage VREF is applied will be referred to as a voltage terminal VREF hereinafter.

One terminal of the capacitance element 210 serves as the input terminal of the high-pass filter circuit 21. The connection node of the capacitance element 210 and the resistance element 212 serves as the output terminal of the high-pass filter circuit 21.

The capacitance element 210 has a capacitance value CHPF. The resistance element 212 has a resistance value RHPF.

The frequency band of a signal (the output signal of a selected cell or the charge potential of a source line) passing through the high-pass filter circuit 21 is set by a cutoff frequency fc based on the capacitance value CHPF of the capacitance element 210 and the resistance value RHPF of the resistance element 212. The cutoff frequency fc in the high-pass filter circuit 21 is given by a following equation (Eq1):

$$fc=1/(2\pi \times RHPF \times CHPF) \qquad (Eq1)$$

For example, the resistance value RHPF is set to 10 kΩ, and the capacitance value CHPF is set to 100 fF. In this case, based on equation (Eq1), the cutoff frequency fc is set to about 160 MHz.

A frequency component higher than the cutoff frequency fc in a cell signal (for example, a voltage pulse) passes through the high-pass filter circuit 21. A frequency component equal to or lower than the cutoff frequency fc in the cell signal is cut off by the high-pass filter circuit 21.

In this way, the high-pass filter circuit 21 can extract a high-frequency component of the cell signal. The high-pass filter circuit 21 outputs a signal in a frequency domain higher than the cutoff frequency fc.

A peak hold circuit 22 is provided between the node NHPF and a node NHD. The input terminal of the peak hold circuit 22 is connected to the node NHPF. The output terminal of the peak hold circuit 22 is connected to the node NHD.

The peak hold circuit 22 includes an operational amplification circuit (comparator) 221, a switch element 222, a capacitance element 223, and a transistor 224.

One input terminal (inverting input terminal) of the operational amplification circuit 221 is connected to the node NHPF (the output terminal of the high-pass filter circuit 21). The other input terminal (non-inverting input terminal) of the operational amplification circuit 221 is connected to the node NHD. The output terminal of the operational amplification circuit 221 is connected to a node NGT.

The operational amplification circuit 221 performs comparison (for example, differential amplification) between a signal (voltage) supplied to the non-inverting input terminal and a signal supplied to the inverting input terminal. In this embodiment, a voltage VHPF of the output terminal NHPF of the filter circuit 21 is supplied to the inverting input terminal of the operational amplification circuit 221. A voltage VHD of the node NHD is supplied to the non-inverting input terminal of the operational amplification circuit 221. For example, the output signal of the operational amplification circuit 221 has a value based on the difference (VHD-VHPF) between the voltages VHD and VHPF. For example, the difference value (VHD-VHPF) may be multiplied by an amplification factor (Az) set in the operational amplification circuit 221.

One terminal of the switch element 222 is connected to the node (the other input terminal of the circuit 221) NHD. The other terminal of the switch element 222 is connected to the voltage terminal VREF.

A control signal RST is supplied to the control terminal of the switch element 222. The control signal RST is used to control ON/OFF of the switch element 222.

The switch element 222 can reset the potential state of the node NHD. The switch element 222 in the ON state connects the node NHD to the voltage terminal VREF. This sets the node NHD in a reset state. The potential of the node NHD in the reset state is set to about the reference voltage VREF. A specific fixed potential (for example, 0.4V to 0.8V) or a ground voltage VSS may be used as the reference voltage VREF.

For example, at the start of a read operation (or at the end of the read operation), the switch element 222 sets the potential of the node NHD in the reset state.

One end of the capacitance element 223 is connected to the node (the other input terminal of the circuit 221) NHD. The other end of the capacitance element 223 is connected to a ground terminal VSS.

The capacitance element 223 has a capacitance value CHD. In accordance with a potential held by the capacitance element 223, the potential of the node NHD is set.

The gate of the transistor 224 is connected to the node (the output terminal of the circuit 221) NGT. One end (one of the source/drain) of the current path of the transistor 224 is connected to a terminal (interconnect) to which a voltage VDD is applied. The other end (the other one of the source/drain) of the current path of the transistor 224 is connected to the node NHD. The terminal to which the voltage VDD is applied will be referred to as a voltage terminal VDD hereinafter.

The transistor 224 operates in accordance with the output signal of the operational amplification circuit 221 (the potential of the node NGT).

In this embodiment, the transistor 224 serves as a p-type field effect transistor. The transistor 224 functions as a current source.

If the potential of the node NGT is at "L" level, the transistor 224 is turned on. If the transistor 224 is turned on, the node NHD is connected to the voltage terminal VDD via the transistor 224 in the ON state. If the potential of the node NGT is at "H" level, the transistor 224 is turned off. If the transistor 224 is turned off, the node NHD is electrically isolated from the voltage terminal VDD by the transistor 224 in the OFF state.

The transistor 224 outputs a current to the node NHD by a driving force corresponding to the potential of the node NGT.

The current source (transistor) 224 is series-connected to the capacitance element 223 between the voltage terminal VDD and the ground terminal VSS.

The peak hold circuit 22 converts the voltage of the high-frequency component of the cell signal into a DC voltage based on the peak value of the voltage (high-frequency voltage) supplied from the high-pass filter circuit 21.

Assume that the voltage VHD of the node NHD at given time during a given period (to be also referred to as a sampling period hereinafter) is held by the capacitance element 223.

The current source (transistor) 224 supplies, to the capacitance element 223, a current corresponding to the magnitude of an output potential VGT of the operational amplification circuit 221.

The operational amplification circuit 221 compares the voltage VHD of the node NHD to the voltage VHPF having passed through the high-pass filter circuit 21.

During the sampling period, if the voltage VHPF is higher than the voltage VHD being held, the output voltage VGT of the operational amplification circuit 221 decreases. For example, the operational amplification circuit 221 outputs the voltage VGT having a negative voltage value to the gate of the p-type transistor 224. Therefore, the output current of the p-type transistor 224 increases.

If a relationship of VHPF>VHD is satisfied (the potential of the node NHD has not reached the peak value of the high-frequency component of the cell signal), the operation of the transistor 224 serving as a current source acts so as to increase the current flowing into the capacitance element 223. Consequently, the capacitance element 223 is charged. As a result, the value of the voltage VHD increases.

During the sampling period, if the voltage VHPF is equal to or lower than the voltage VHD being held, the output voltage VGT of the operational amplification circuit 221 rises. For example, the operational amplification circuit 221 outputs the voltage VGT having a positive voltage value (or 0V) to the gate of the p-type transistor 224. Consequently, the output current of the p-type transistor 224 decreases.

Therefore, if a relationship of VHPF≤VHD is satisfied (the potential of the node NHD has reached the peak value of the high-frequency component of the cell signal), the operation of the current source (transistor) 224 acts so as to decrease the current flowing into the capacitance element 223. Consequently, charge of the capacitance element 223 is suppressed. As a result, the value of the voltage VHD remains unchanged.

With the operations of the operational amplification circuit 221 and current source 224, the maximum value (peak value) of the potential of the node NHPF is obtained as the voltage VHD.

The peak hold circuit 22 outputs, to a sense amplifier circuit 23, a voltage set (fixed) to the obtained peak value. This changes the cell signal into a DC signal based on the peak value of the high-frequency component included in the cell signal.

As described above, the peak hold circuit 22 can supply, to the sense amplifier circuit 23, a DC voltage based on the peak value of the high-frequency component (a signal having a frequency domain higher than a cutoff frequency) of the cell signal.

The sense amplifier circuit 23 is provided between the node NHD and a data output terminal DOUT. One input terminal of the sense amplifier circuit 23 is connected to the node NHD.

The sense amplifier circuit 23 determines data in a selected cell MC using the voltage VHD of the node NHD. The sense amplifier circuit 23 compares the voltage VHD to a reference value to determine the data.

If, for example, the DC method is applied to the read operation of the MRAM, the sense amplifier circuit 23 compares the voltage VHD to the reference voltage in the read operation adopting the DC method.

If, for example, the reference cell method is applied to the read operation of the MRAM, the sense amplifier circuit 23 compares the voltage VHD to a potential from a reference cell in the read operation adopting the reference cell method.

If, for example, the self-reference read method is applied to the read operation of the MRAM, the sense amplifier circuit 23 compares, in the read operation adopting the self-reference read method, the potential of the node NHD obtained by the first reading before writing reference data (for example, "0" data) in the selected cell to the potential of the node NHD obtained by the second reading after writing the reference data in the selected cell.

The sense amplifier circuit 23 receives the peak potential VHD held by the peak hold circuit 22.

The output signal VHD of the peak hold circuit 22 after the peak value is held is regarded as a DC signal (DC voltage). Since the DC signal is input to the sense amplifier circuit 23, the sense amplifier circuit 23 can sense and latch, at an arbitrary timing, the cell signal converted into the DC signal.

(2) Operation Example

An example of the operation of the MRAM according to this embodiment will be described with reference to FIG. 8.

Figure 8:
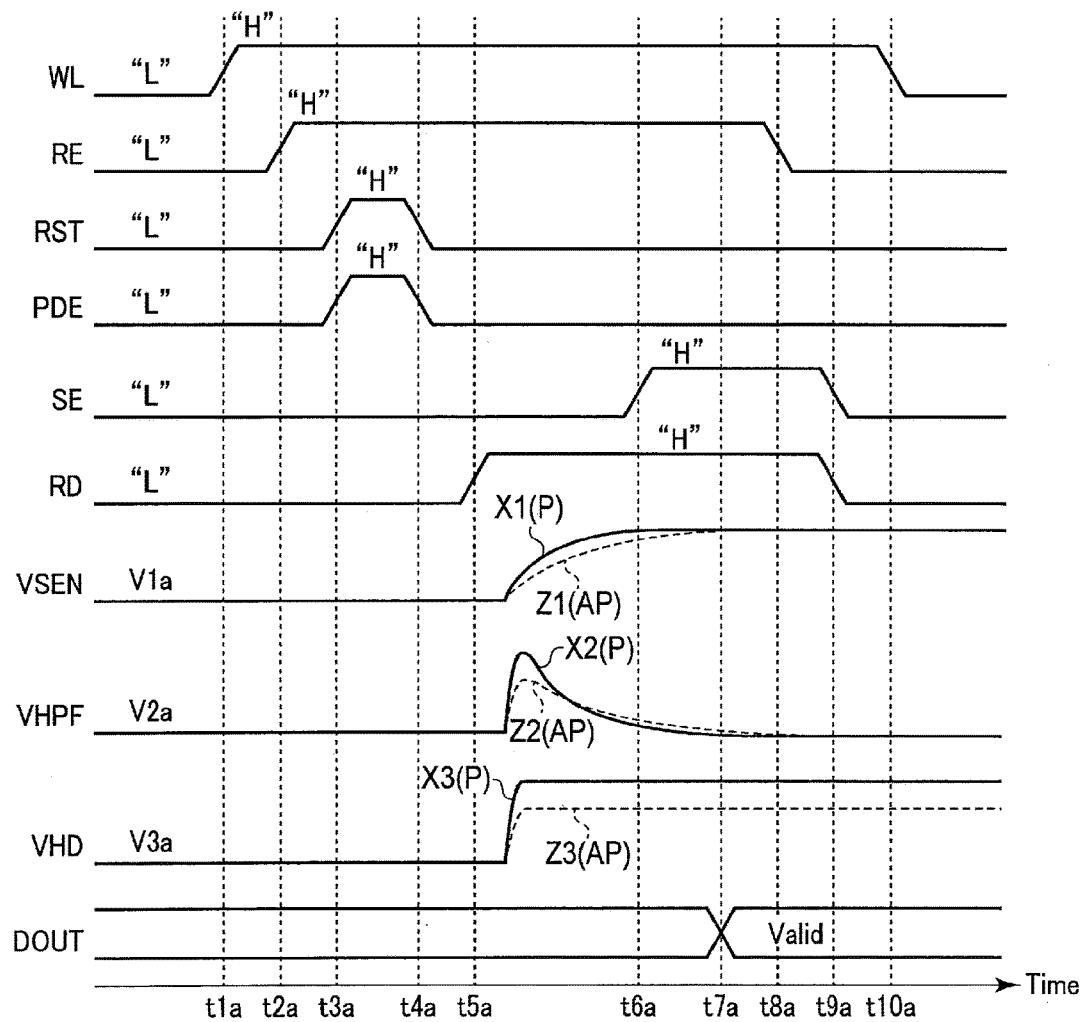
FIG. 8 is a timing chart showing an example of the operation of the memory device according to the first embodiment.

FIG. 8 is a timing chart for explaining an operation example of the read operation of the MRAM according to this embodiment. In addition to FIG. 8, FIGS. 1, 2, 3, 4, 5, 6, and 7 are appropriately used to explain the read operation of the MRAM according to this embodiment.

If a processor 9 requests given data, a memory controller 90 transmits a read command and various control signals to an MRAM 1.

The MRAM 1 starts to read data from a selected address ADR based on the command and control signals.

At time t1a, a word line driver 121 changes the potential of a selected word line WL from "L" level to "H" level.

A voltage (the ON voltage of a cell transistor 410) at "H" level turns on the cell transistor 410 of the selected cell MC. This activates the selected cell.

Note that at the start of the read operation, the initial potential of the node NSEN is set to a voltage value V1a. The initial potential of the node NHPF is set to a voltage value V2a. The initial potential of the node NHD is set to a voltage value V3a (for example, the reference voltage VREF or ground voltage VSS).

At time t2a, a read circuit 126 changes the signal level of a control signal RE from "L" level to "H" level. This sets the switch element SW3 in the ON state. The sense amplifier circuit 23 is electrically connected to a source line SL via the switch element SW3 in the ON state.

At time t3a, the read circuit 126 changes the signal level of a control signal RST from "L" level to "H" level. The signal RST at "H" level turns on a switch element 222.

This connects the node NHD to the ground terminal VSS via the switch element 222 in the ON state. The node NHD is discharged. The potential of the node NHD is set in the reset state (the voltage VREF or VSS).

At the same time as the reset of the node NHD, the read circuit 126 changes the signal level of a control signal PDE from "L" level to "H" level. The signal PDE at "H" level sets a switch element SW2 in the ON state.

This connects the source line SL to the ground terminal VSS via the switch element 222 in the ON state. The source line SL is discharged. The potential of the source line SL is set in the reset state.

At time t4a, the read circuit 126 changes the signal level of the control signal RST from "H" level to "L" level. The read circuit 126 changes the signal level of the control signal PDE from "H" level to "L" level. This electrically isolates the node NHD and the source line SL from the ground terminals VSS.

At time t5a, the read circuit 126 changes the signal level of a control signal RD from "L" level to "H" level. This activates a read driver 500. The signal at "H" level sets a switch element SW0 in the ON state.

The read driver 500 outputs a read pulse RP to a bit line BL via the switch element SW0 in the ON state.

The read pulse (voltage or current) RP supplied from the read driver 500 to the bit line BL causes a cell current to flow into the selected cell MC. For example, charges generated from the cell current are accumulated in capacitances 60A and 60B of the source line SL.

As described above, a charge waveform (the output signal of the selected cell) VSEN of a node NSEN at the time of application of the read voltage is different between a case in which an MTJ element 400 is in the low-resistance state (P state) (a waveform X1 in FIG. 8) and a case in which the MTJ element 400 is in the high-resistance state (AP state) (a waveform Z1 in FIG. 8).

The voltage VSEN is supplied to the high-pass filter circuit 21.

The high-pass filter circuit 21 passes a high-frequency component, having a frequency higher than the cutoff frequency fc, of the supplied voltage VSEN.

This reflects the potential of the high-frequency component (a frequency domain higher than the cutoff frequency) of the cell signal on the voltage (potential) VHPF of the node NHPF, as represented by waveforms X2 and Z2 shown in FIG. 8.

The potential VHPF of the node NHPF is supplied to the peak hold circuit 22.

The peak hold circuit 22 detects the peak value of the potential VHPF (the maximum value of the high-frequency component) by the above-described operations of the operational amplification circuit 221 and current source 224, and holds the detected peak value.

The peak hold circuit 22 outputs the held peak value to the node NHD. This sets the potential VHD of the node NHD to the peak value, as represented by waveforms X3 and X3 shown in FIG. 8. In this way, the cell signal is converted into a DC voltage based on the peak value of the potential of the high-frequency component, and output to the node NHD.

Note that as described above, the potential of each of the nodes NHPF and NHD is different between a case in which the MTJ element is in the P state and a case in which the MTJ element is in the AP state. Therefore, in the signal output from the peak hold circuit 22 as well, the peak value corresponding to the output signal from the MTJ element in the P state is different from the peak value corresponding to the output signal from the MTJ element in the AP state.

At time t6a, the read circuit 126 changes the signal level of a control signal SE from "L" level to "H" level. This activates the sense amplifier circuit 23.

The sense amplifier circuit 23 senses and latches the output signal (the potential of the node NHD) VHD from the peak hold circuit 22 at the timing when the signal SE is set at "H" level.

The sense amplifier circuit 23 compares the sensed value to the reference value (for example, the DC voltage, the output potential of the reference cell, or the potential obtained by the first reading for the selected cell).

A value (potential) based on a comparison result is set as the output signal of the sense amplifier circuit 23.

At time t7a, the signal of the data output terminal DOUT of the MRAM 1 is set in an enable state. The output signal of the sense amplifier circuit 23 is output to the outside of the MRAM 1 as data DOUT read from the selected cell.

At time t8a, the read circuit 126 changes the signal level of the control signal RE from "H" level to "L" level. The switch element SW3 is set in the OFF state by the signal RE at "L" level. The read circuit 126 is electrically isolated from the source line SL by the switch element SW3 in the OFF state.

At time t9a, the read circuit 126 changes the signal levels of the control signals SE and RD from "H" level to "L" level.

The signal SE at "L" level deactivates the sense amplifier circuit 23.

The signal RD at "L" level deactivates the read driver 500. Supply of the read pulse RP from the read driver 500 to the bit line BL is stopped.

For example, the signal level of a control signal SS is set at "L" level. The switch element SW0 is set in the OFF state. This electrically isolates the read driver 500 from the bit line BL.

At time t10a, the word line driver 121 changes the potential of the selected word line WL from "H" level to "L" level. The cell transistor 410 is set in the OFF state. This deactivates the selected cell.

The data DOUT is transferred from the MRAM 1 to the memory controller 90. The data from the MRAM 1 is used for calculation processing by a CPU 91.

As described above, the read operation of the MRAM according to this embodiment is completed.

Note that a sequencer 127 may control the signal levels of the respective signals RE, RST, PDE, SE, and RD.

(3) Summary

In the resistance change type memory as the memory device according to this embodiment, the high-pass filter circuit of the read circuit has the cutoff frequency set by the capacitance elements and resistance element.

The high-pass filter circuit passes a frequency component, higher than the cutoff frequency, of the output signal from the selected cell (or a quantity of electricity on which the output signal is reflected).

In the resistance change type memory according to this embodiment, the peak hold circuit detects the peak value of the high-frequency component of the output signal from the selected cell, and generates a DC signal corresponding to the output signal from the selected cell based on the detected peak value.

In the resistance change type memory according to this embodiment, the sense amplifier circuit determines the data in the selected cell using the DC signal. The sense amplifier circuit outputs data based on a determination result.

As described above, the memory device according to this embodiment can improve the read accuracy and read speed by relatively simple circuits.

The memory device according to this embodiment can thus improve the operation characteristic.

[C] Second Embodiment

A memory device according to the second embodiment will be described with reference to FIGS. 9 and 10.

(1) Configuration Example

An example of the configuration of a resistance change type memory (for example, an MRAM) as the memory device according to this embodiment will be described with reference to FIG. 9.

Figure 9:
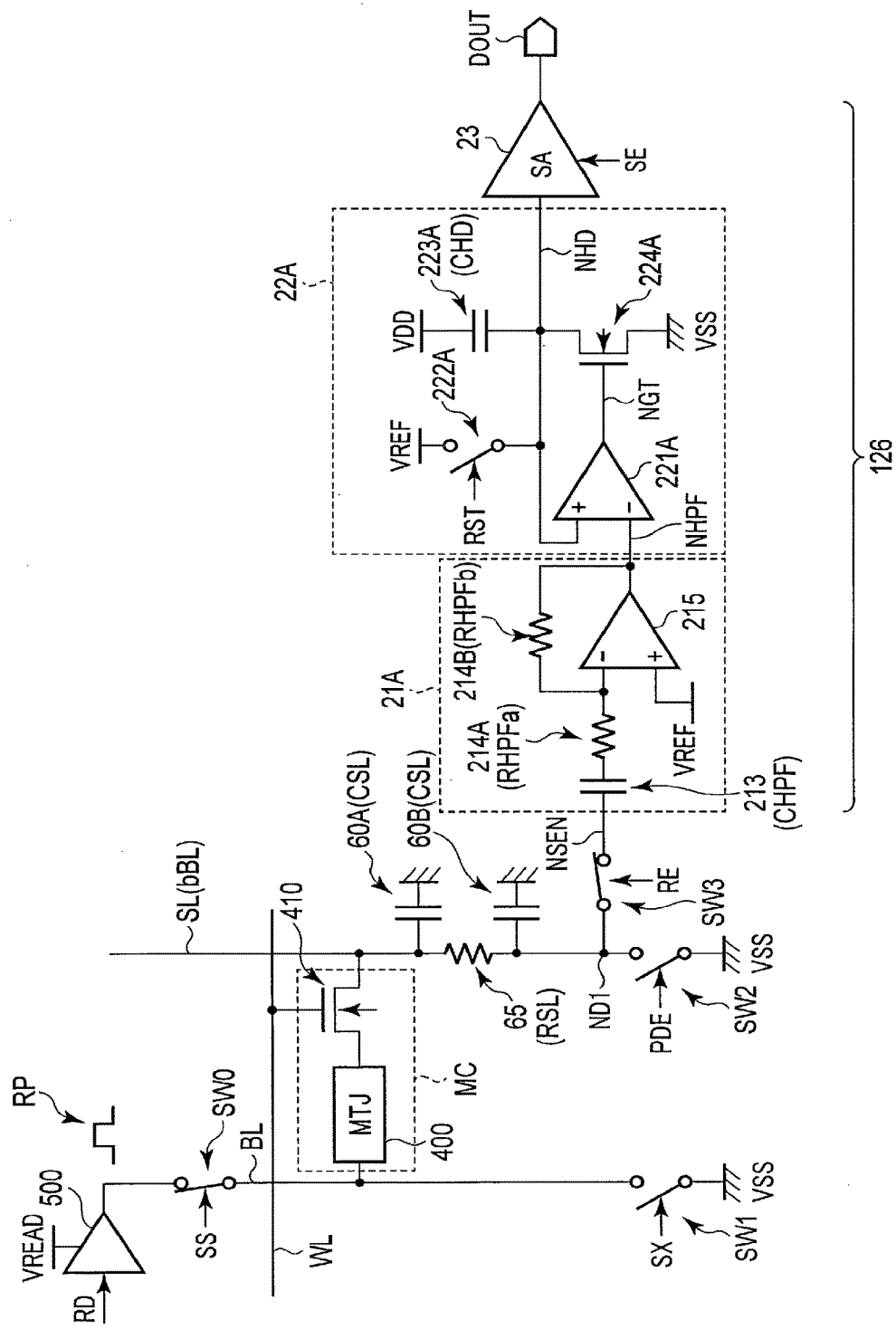
FIG. 9 is a circuit diagram showing an example of the configuration of a memory device according to the second embodiment.

FIG. 9 is a schematic circuit diagram for explaining the internal configuration of a read circuit in the MRAM according to this embodiment.

In this embodiment, an active filter is used as a high-pass filter circuit in the read circuit. This allows the MRAM of this embodiment to expand a read margin.

As shown in FIG. 9, in the read circuit of the MRAM according to this embodiment, an active high-pass filter circuit 21A includes a capacitance element 213, resistance elements 214A and 214B, and an operational amplification circuit 215.

One terminal of the capacitance element 213 is connected to a switch element SW3. The other terminal of the capacitance element 213 is connected to one end of the resistance element 214A.

The other terminal of the resistance element 214A is connected to one input terminal (non-inverting input terminal) of the operational amplification circuit 215.

One input terminal of the resistance element 214B is connected to one input terminal of the operational amplification circuit 215. The other terminal of the resistance element 214B is connected to the output terminal of the operational amplification circuit 215.

One input terminal of the operational amplification circuit 215 is connected to the other terminal of the resistance element 214A and one terminal of the resistance element 214B. The other input terminal (non-inverting input terminal) of the operational amplification circuit 215 is connected to a voltage terminal VREF.

The output terminal of the operational amplification circuit 215 is connected to the other end of the resistance element 214B and a node NHPF.

One terminal of the capacitance element 213 serves as the input terminal of the active high-pass filter circuit 21A.

The resistance element 214B is connected in parallel to the operational amplification circuit 215 between one input terminal and output terminal of the operational amplification circuit 215.

The capacitance element 213 has a capacitance value CHPF. The resistance element 214A has a resistance value RHPFa. The resistance element 214B has a resistance value RHPFb.

A cutoff frequency fc in the active high-pass filter circuit 21A is given by a following equation (Eq2):

$$fc = 1/(2\pi \times RHPFa \times CHPF) \quad (Eq2)$$

In this way, the active high-pass filter circuit 21A can extract a high-frequency component of a cell signal. The active high-pass filter circuit 21A outputs a signal in a high frequency domain higher than the cutoff frequency fc.

A signal component (in this example, a signal in a node NSEN) passing through the active high-pass filter circuit 21A is amplified by a magnification Amp based on the resistance ratio between the two resistance elements 214A and 214B in the circuit 21A. The magnification Amp is given by a following equation (Eq3):

$$Amp = -RHPFb/RHPFa \quad (Eq3)$$

In this way, the active filter is used for the high-pass filter circuit 21A through which the cell signal passes.

With this configuration, in the MRAM according to this embodiment, a read circuit 126 can amplify a signal of a high-frequency component passing through the high-pass filter circuit 21A.

Therefore, in this embodiment, the read circuit 126 can increase the difference between the peak value of the signal after passing through the filter circuit 21A when an MTJ element 400 is in the high-resistance state and the peak value after passing through the filter circuit 21A when the MTJ element 400 is in the low-resistance state.

Since the operational amplification circuit 215 is used for the filter circuit 21A, the polarity of the output signal of the filter circuit 21A is inverted with respect to the polarity of the signal input to the filter circuit 21A.

The internal configuration of a peak hold circuit 22A is set to cope with inversion of the polarity.

The peak hold circuit 22A includes an operational amplification circuit (comparator) 221A, a switch element 222A, a capacitance element 223A, and a transistor 224A.

One input terminal (inverting input terminal) of the operational amplification circuit 221A is connected to the node NHPF (the output terminal of the high-pass filter circuit 21A). The other input terminal (non-inverting input terminal) of the operational amplification circuit 221A is connected to a node NHD. The output terminal of the operational amplification circuit 221A is connected to a node NGT.

The operational amplification circuit 221A compares a potential VHPF of the node NHPF to a potential VHD of the node NHD. The operational amplification circuit 221A outputs, to the node NGT, a value based on the comparison result (for example, a difference value "VHD-VHPF") of the input voltages VHD and VHPF.

One terminal of the switch element 222A is connected to the node (the other input terminal of the circuit 221A) NHD. The other terminal of the switch element 222A is connected to the voltage terminal VREF. A control signal RST is supplied to the control terminal of the switch element 222A. The control signal RST is used to control ON/OFF of the switch element 222A.

The switch element 222A can reset the potential state of the node NHD based on the control signal RST. In this embodiment, the potential of the node NHD in the reset state is set to about the voltage VREF.

One terminal of the capacitance element 223A is connected to the node (the other input terminal of the circuit 221A) NHD. The other terminal of the capacitance element 223A is connected to a voltage terminal VDD.

The capacitance element 223A has a capacitance value CHD. The potential of the node NHD is set in accordance with the potential held by the capacitance element 223A.

The gate of the transistor 224A is connected to the node (the output terminal of the circuit 221A) NGT. One terminal of the current path of the transistor 224A is connected to the node NHD. The other terminal of the current path of the transistor 224A is connected to a ground terminal VSS.

The transistor 224A is driven in accordance with the output signal of the operational amplification circuit 221A (the potential of the node NGT).

The transistor 224A functions as a current source.

In this embodiment, the transistor 224A serves as an n-type field effect transistor. The transistor 224A serving as a current source draws a current from the node NHD to the ground terminal VSS.

As described above, the polarity of the output signal VHPF from the active high-pass filter circuit 21A is inverted with respect to the polarity of the cell signal.

Therefore, in this embodiment, the peak hold circuit 22A is configured to hold the minimum value of the potential VHPF of the node NHPF.

In the read circuit 126 of the MRAM according to this embodiment, the connections of the voltage terminals VDD, VREF, and VSS to the components of the peak hold circuit 22A are inverted with respect to the connections of the voltage terminals to the components of the peak hold circuit 22 according to the first embodiment. In the peak hold circuit 22A, the n-type field effect transistor 224A is used as a current source in the circuit 22A.

Note that the operation (function and action) of the peak hold circuit 22A according to this embodiment is substantially the same as the operation of the peak hold circuit 22 according to the first embodiment.

During a sampling period, if the input signal (the output signal of the high-pass filter circuit) VHPF to the peak hold circuit 22A is lower than the voltage VHD in the hold state, the output voltage VGT of the operational amplification circuit 221A rises. In this case, for example, the operational amplification circuit 221A outputs the voltage VGT having a positive voltage value to the gate of the n-type transistor 224A.

If a relationship of VHPF<VHD is satisfied (the hold voltage VHD has not reached the minimum value), the transistor 224A serving as a current source operates so as to increase the current flowing from the capacitance element 223A to the node NHD and ground terminal VSS. Therefore, the capacitance element 223A is discharged. As a result, the voltage VHD of the node NHD decreases.

During the sampling period, if the input signal VHPF to the peak hold circuit 22A is equal to or higher than the voltage VHD in the hold state, the output potential VGT of the operational amplification circuit 221A lowers. In this case, for example, the operational amplification circuit 221A outputs the voltage VGT having a negative voltage value (or 0 V) to the gate of the n-type transistor 224A.

Therefore, if a relationship of VHPF VHD is satisfied (the hold voltage VHD has reached the minimum value), the transistor 224A operates so as to decrease the current flowing from the capacitance element 223A to the node NHD. Therefore, discharge of the capacitance element 223A is suppressed. As a result, the potential VHD of the node NHD substantially remains unchanged.

With the operation of the peak hold circuit 22A, the minimum potential of the voltage VHPF can be acquired as the voltage VHD.

The voltage VHD held by the operation of the peak hold circuit 22A is supplied to the sense amplifier circuit 23 as a DC signal.

Note that in this embodiment, when the polarity of the above-described signal is inverted, the voltage value of the voltage VHD based on the cell signal from the selected cell including the MTJ element in the AP state is higher than that of the voltage VHD based on the cell signal from the selected cell including the MTJ element in the P state.

(2) Operation Example

An example of the operation of the MRAM according to this embodiment will be described with reference to FIG. 10.

FIG. 10 is a timing chart for explaining an example of the operation of the MRAM according to this embodiment.

As shown in FIG. 10, during a period from time tib to time t4b, the signal levels of respective signals WL, RE, RST, and PDE are controlled in substantially the same manner as that for control of the respective signals during a period from time t1a to time t4a in FIG. 8.

In this embodiment, for example, at the time of a read operation, the initial potential of the node NSEN is set to a voltage value V1b (for example, the ground terminal VSS). The initial potential of the node NHPF is set to a voltage value V2b. The initial potential of the node NHD is set to the voltage value V1b (for example, the voltage value VREF).

With respect to potentials VSEN, VHPF, and VHD of the nodes, lines (waveforms) X1A, X2A, and X3A correspond to a case in which the magnetization alignment state of the MTJ element 400 is the P state. With respect to the potentials VSEN, VHPF, and VHD of the nodes, liens (waveforms) Z1A, Z2A, and Z3A correspond to a case in which the magnetization alignment state of the MTJ element 400 is the AP state.

At time t5b, the read circuit 126 changes the signal level of a control signal RD from "L" level to "H" level. A signal SS at "H" level is supplied to a switch element SW0.

This causes the read driver 500 to supply a read pulse RP to a bit line BL via the switch element SW0 in the ON state.

In the read circuit 126, potentials VNSEN, VNHPF, and VNHD of the nodes NSEN, NHPF, and NHD fluctuate in accordance with the output signal from the selected cell, as represented by the waveforms X1A, X2A, X3A, Z1A, Z2A, and Z3A shown in FIG. 10.

In this embodiment, the node NSEN is charged by the output from the selected cell. The potential of the node NSEN rises from the potential Vlb in the initial state with a tendency according to the resistance state of the MTJ element in the selected cell. With respect to the signal voltage having passed through the active high-pass filter circuit 21A, the potentials VHPF and VHD of the nodes NHPF and NHD respectively lower from the potentials V2b and V3b in the initial state with a tendency according to the resistance state of the MTJ element in the selected cell.

The active high-pass filter circuit 21A amplifies the high-frequency component of the voltage (cell signal) VSEN in the node NSEN, and outputs the amplified signal of high-frequency component to the peak hold circuit 22A.

In the peak hold circuit 22A, discharge of the capacitance element 223A is controlled by the operations of the operational amplification circuit 221A and the current source 224A according to the above-described magnitude relationship between the voltages VHPF and VHD. This cases the peak hold circuit 22A to sample the minimum value of the voltage VHPF of the node NHPF.

The peak hold circuit 22A outputs a signal having the sampled peak value (minimum value) to the node NHD.

This supplies a DC signal based on the high-frequency component of the cell signal to the sense amplifier circuit 23.

At time t6b, the read circuit 126 changes the signal level of a control signal SE from "L" level to "H" level.

This causes the sense amplifier circuit 23 to sense and latch the potential of the node NHD. The sense amplifier circuit 23 compares the supplied signal (the output signal of the peak hold circuit) to a reference value. As a result, data in the selected cell is determined.

As shown in FIG. 10, at time t6b, the voltage value of the voltage (waveform Z3A) VHD based on the cell signal from the selected cell including the MTJ element in the AP state is higher than that of the voltage (waveform Z3A) VHD based on the cell signal from the selected cell including the MTJ element in the P state.

After that, during a period from time t7b to time t10b, the signal levels of the signals WL, RE, RST, and PDE are controlled in substantially the same manner as that for control of the signals during a period from time t7a to t10a in FIG. 8.

At time t7b, data DOUT is set in an enable state, and output to a memory controller 90 (processor 9).

At time t8b, the read circuit 126 is electrically isolated from the source line SL by the control signal RE at "L" level.

During a period from time t9b to time t10b, the control signals SE and RD at "L" level deactivate the sense amplifier circuit 23 and the read driver 500, respectively.

At time t10b, the potential of a selected word line WL is set at "L" level, and the selected cell is deactivated.

Thus, the read operation of the MRAM according to this embodiment is completed.

(3) Summary

In the memory device according to this embodiment, the active high-pass filter circuit is used as the filter circuit of the read circuit.

With this configuration, the memory device according to this embodiment can increase the difference between the signal (voltage value) from the memory cell including the memory element in the low-resistance state and the signal from the memory cell including the memory element in the high-resistance state.

As a result, the memory device according to this embodiment can increase a read margin.

Therefore, the memory device according to this embodiment can further improve the effects of the above-described other embodiments.

[D] Modification

A modification of the memory device according to the embodiment will be described with reference to FIG. 11.

FIG. 11 is a circuit diagram for explaining the modification of the memory device (resistance change type memory) according to the embodiment.

As shown in FIG. 11, in the read circuit 126 of an MRAM serving as a resistance change type memory according to the modification, the high-pass filter circuit 21, the peak hold circuit 22, and the sense amplifier circuit 23 may be provided on the side of the bit line BL.

The high-pass filter circuit 21 is connected to a node ND1z of the bit line BL.

The peak hold circuit 22 is connected to the output terminal (node) NHPF of the high-pass filter circuit 21.

The sense amplifier circuit 23 is connected to the output terminal (node) NHD of the peak hold circuit 22.

A switch element SW1z is connected to the bit line BL. The control signal PDE is connected to the control terminal of the switch element SW1z. The control signal PDE is used to control ON/OFF of the switch element SW1z.

A switch element SW2z is connected to the source line SL. A control signal SXX is connected to the control terminal of the switch element SW2z. The control signal SXX is used to control ON/OFF of the switch element SW2z.

For example, the read driver 500 is connected to the source line SL via a switch element SW0z. A control signal SSX is connected to the control terminal of the switch element SW0z. The control signal SSX is used to control ON/OFF of the switch element SW0z.

The bit line BL includes capacitances (for example, parasitic capacitances) 60Az and 60Bz and a resistance (for example, a parasitic resistance) 65z. The capacitances 60Az and 60Bz each have a capacitance value CBL. The resistance 65z has a resistance value RBL.

If the read circuit 126 is connected to the bit line BL, the read circuit 126 determines data in the selected cell based on a potential fluctuation of the bit line BL (the magnitude of charge or discharge of the bit line), and reads the data.

The potential of the bit line BL changes by a fluctuation amount corresponding to the resistance value of the MTJ element in the selected cell. For example, the fluctuation amount of the potential of the bit line when the selected cell includes the MTJ element in the P state is larger than that of the potential of the bit line when the selected cell includes the MTJ element in the AP state.

The high-pass filter circuit 21 passes a high-frequency component of the potential of the bit line BL based on the cutoff frequency fc.

The peak hold circuit 22 detects the peak value (maximum or minimum value during the sampling period) of the potential of the high-frequency component from the high-pass filter circuit 21, and holds the detected value.

The peak hold circuit 22 outputs a DC voltage based on the held peak value.

The sense amplifier circuit 23 determines data in the selected cell using the output signal from the peak hold circuit 22.

The determination result of the sense amplifier circuit 23 is output as the data in the selected cell from the MRAM 1 to the memory controller 90 (or processor 9).

The internal configurations and operations of the filter circuit and peak hold circuit in the MRAM according to each of the above-described embodiments can be appropriately applied to the MRAM 1 according to the modification.

Even if the MRAM has the circuit configuration in which the respective circuits 21, 22, and 23 in the read circuit 126 are connected to the bit line BL, as in this modification, the MRAM according to this modification can obtain the same effect as in each of the above-described embodiments.

[E] Others

In an MRAM serving as a memory device according to this embodiment, a parallel magnetization type MTJ element may be used as an MTJ element 400. In the parallel magnetization type MTJ element, the magnetization directions of magnetic layers 401 and 402 are substantially parallel to their layer surfaces. In the parallel magnetization type MTJ element, with respect to the magnetic anisotropies of the magnetic layers 401 and 402, the magnetization directions of the magnetic layers 401 and 402 are made to be substantially parallel to their layer surfaces using the shape magnetic anisotropies of the magnetic layers.

The MRAM serving as the memory device according to this embodiment may be mounted in a processor 9. The MRAM according to this embodiment may be used as a memory in a memory controller 90 or a memory in a CPU 91.

The embodiment has explained the example in which the MRAM is used as the memory device. However, a magnetic memory (a memory device using a magnetoresistive effect element (for example, an MTJ element)) other than the MRAM may be used as the memory device according to this embodiment.

The memory device according to this embodiment may be a memory device other than the MRAM (magnetic memory). For example, one memory device selected from an ReRAM, PCRAM, ion memory, DRAM, SRAM, and flash memory may be applied to the memory device according to this embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a memory cell;
   a read driver configured to supply a read pulse to the memory cell at the time of a read operation for the memory cell;
   a filter circuit configured to output a second signal in a first frequency domain from a first signal, the first signal being outputted from the memory cell by the read pulse;
   a hold circuit configured to hold a peak value of the second signal; and
   a sense amplifier circuit configured to read data from the memory cell based on the peak value,
   wherein the filter circuit comprises a high pass filter circuit, and
   the first frequency domain is higher than a cutoff frequency of the filter circuit in the first signal.

2. The device according to claim 1, wherein the filter circuit includes
   a first capacitance element having a first terminal electrically connected to the memory cell and a second terminal electrically connected to the hold circuit, and
   a resistance element having a third terminal electrically connected to the second terminal and a fourth terminal electrically connected to a first voltage terminal.

3. The device according to claim 1, wherein
   the filter circuit comprises an active high-pass filter circuit, and
   the second signal is a signal having the first frequency domain higher than a cutoff frequency of the filter circuit in the first signal and is obtained by amplifying a signal level of the first signal.

4. The device according to claim 3, wherein the filter circuit includes
   a capacitance element having a first terminal electrically connected to the memory cell, and a second terminal,
   a first resistance element having a third terminal electrically connected to the second terminal, and a fourth terminal,
   an operational amplifier having a first input terminal electrically connected to the fourth terminal, a second input terminal electrically connected to a second voltage terminal, and an output terminal connected to the hold circuit, and
   a second resistance element having a fifth terminal electrically connected to the first input terminal and a sixth terminal electrically connected to the output terminal.

5. The device according to claim 1, wherein the hold circuit includes
   an operational amplifier having a first input terminal electrically connected to a first output terminal of the filter circuit, a second input terminal electrically connected to a first node, and a second output terminal,
   a capacitance element having a first terminal electrically connected to the first node and a second terminal electrically connected to a first voltage terminal, a switch element having a third terminal electrically connected to the first node and a fourth terminal electrically connected to a second voltage terminal, and a transistor having a gate electrically connected to the second output terminal of the operational amplifier, a fifth terminal electrically connected to the first node, and a sixth terminal electrically connected to a third voltage terminal.

6. The device according to claim 1, wherein
the hold circuit outputs a DC signal based on the peak value, and
the sense amplifier circuit reads the data using the DC signal.

7. The device according to claim 1, wherein the memory cell includes a variable resistance element.

8. The device according to claim 1, wherein the memory cell includes a magnetoresistive effect element.

9. A memory system comprising:
a memory device configured to store data; and
a processor configured to transmit a command to the memory device to read the data,
wherein the memory device includes
a memory cell;
a read driver configured to supply a read pulse to the memory cell at the time of a read operation for the memory cell based on the command;
a filter circuit configured to output a second signal in a first frequency domain from a first signal, the first signal being outputted from the memory cell by the read pulse;
a hold circuit configured to hold a peak value of the second signal; and
a sense amplifier circuit configured to read data from the memory cell based on the peak value,
wherein the filter circuit comprises a high pass filter circuit, and
the first frequency domain is higher than a cutoff frequency of the filter circuit in the first signal.

10. The system according to claim 9, wherein the filter circuit includes
a first capacitance element having a first terminal electrically connected to the memory cell and a second terminal electrically connected to the hold circuit, and
a resistance element having a third terminal electrically connected to the second terminal and a fourth terminal electrically connected to a first voltage terminal.

11. The system according to claim 9, wherein
the filter circuit comprises an active high-pass filter circuit, and
the second signal is a signal having the first frequency domain higher than a cutoff frequency of the filter circuit in the first signal and is obtained by amplifying a signal level of the first signal.

12. The system according to claim 11, wherein the filter circuit includes
a capacitance element having a first terminal electrically connected to the memory cell, and a second terminal,
a first resistance element having a third terminal electrically connected to the second terminal, and a fourth terminal,
an operational amplifier having a first input terminal electrically connected to the fourth terminal, a second input terminal electrically connected to a second voltage terminal, and an output terminal electrically connected to the hold circuit, and a second resistance element having a fifth terminal electrically connected to the first input terminal and a sixth terminal electrically connected to the output terminal.

13. The system according to claim 9, wherein
the hold circuit includes
an operational amplifier having a first input terminal electrically connected to a first output terminal of the filter circuit, a second input terminal electrically connected to a first node, and a second output terminal,
a capacitance element having a first terminal connected to the first node and a second terminal connected to a first voltage terminal,
a switch element having a third terminal electrically connected to the first node and a fourth terminal electrically connected to a second voltage terminal, and
a transistor having a gate electrically connected to the second output terminal of the operational amplifier, a fifth terminal electrically connected to the first node, and a sixth terminal electrically connected to a third voltage terminal.

14. The system according to claim 9, wherein
the hold circuit outputs a DC signal based on the peak value, and
the sense amplifier circuit reads the data using the DC signal.

15. The system according to claim 9, wherein the memory cell includes a variable resistance element.

16. The system according to claim 9, wherein the memory cell includes a magnetoresistive effect element.

17. A memory device comprising:
a memory cell;
a read driver configured to supply a read pulse to the memory cell at the time of a read operation for the memory cell;
a filter circuit configured to output a second signal in a first frequency domain from a first signal, the first signal being outputted from the memory cell by the read pulse;
a hold circuit configured to hold a peak value of the second signal; and
a sense amplifier circuit configured to read data from the memory cell based on the peak value;
wherein
the filter circuit comprises an active high-pass filter circuit, and
the second signal is a signal having the first frequency domain higher than a cutoff frequency of the filter circuit in the first signal and is obtained by amplifying a signal level of the first signal.

18. The device according to claim 17, wherein
the filter circuit comprises a high pass filter circuit, and
the first frequency domain is higher than a cutoff frequency of the filter circuit in the first signal.

19. The device according to claim 3, wherein the filter circuit includes
a capacitance element having a first terminal electrically connected to the memory cell, and a second terminal,
a first resistance element having a third terminal electrically connected to the second terminal, and a fourth terminal,
an operational amplifier having a first input terminal electrically connected to the fourth terminal, a second input terminal electrically connected to a second voltage terminal, and an output terminal connected to the hold circuit, and a second resistance element having a fifth terminal electrically connected to the first input terminal and a sixth terminal electrically connected to the output terminal.

20. The device according to claim 17, wherein the hold circuit includes an operational amplifier having a first input terminal electrically connected to a first output terminal of the filter circuit, a second input terminal electrically connected to a first node, and a second output terminal, a capacitance element having a first terminal electrically connected to the first node and a second terminal electrically connected to a first voltage terminal, a switch element having a third terminal electrically connected to the first node and a fourth terminal electrically connected to a second voltage terminal, and a transistor having a gate electrically connected to the second output terminal of the operational amplifier, a fifth terminal electrically connected to the first node, and a sixth terminal electrically connected to a third voltage terminal.

21. The device according to claim 17, wherein the hold circuit outputs a DC signal based on the peak value, and the sense amplifier circuit reads the data using the DC signal.

22. The device according to claim 17, wherein the memory cell includes a variable resistance element.

23. The device according to claim 17, wherein the memory cell includes a magnetoresistive effect element.

24. A memory system comprising:

a memory device configured to store data; and a processor configured to transmit a command to the memory device to read the data, wherein the memory device includes a memory cell;

a read driver configured to supply a read pulse to the memory cell at the time of a read operation for the memory cell based on the command;

a filter circuit configured to output a second signal in a first frequency domain from a first signal, the first signal being outputted from the memory cell by the read pulse;

a hold circuit configured to hold a peak value of the second signal; and a sense amplifier circuit configured to read data from the memory cell based on the peak value; wherein the filter circuit comprises an active high-pass filter circuit, and the second signal is a signal having the first frequency domain higher than a cutoff frequency of the filter circuit in the first signal and is obtained by amplifying a signal level of the first signal.

25. The system according to claim 24, wherein the filter circuit comprises a high pass filter circuit, and the first frequency domain is higher than a cutoff frequency of the filter circuit in the first signal.

26. The system according to claim 24, wherein the filter circuit includes a capacitance element having a first terminal electrically connected to the memory cell, and a second terminal, a first resistance element having a third terminal electrically connected to the second terminal, and a fourth terminal, an operational amplifier having a first input terminal electrically connected to the fourth terminal, a second input terminal electrically connected to a second voltage terminal, and an output terminal electrically connected to the hold circuit, and a second resistance element having a fifth terminal electrically connected to the first input terminal and a sixth terminal electrically connected to the output terminal.

27. The system according to claim 24, wherein the hold circuit includes an operational amplifier having a first input terminal electrically connected to a first output terminal of the filter circuit, a second input terminal electrically connected to a first node, and a second output terminal, a capacitance element having a first terminal connected to the first node and a second terminal connected to a first voltage terminal, a switch element having a third terminal electrically connected to the first node and a fourth terminal electrically connected to a second voltage terminal, and a transistor having a gate electrically connected to the second output terminal of the operational amplifier, a fifth terminal electrically connected to the first node, and a sixth terminal electrically connected to a third voltage terminal.

28. The system according to claim 24, wherein the hold circuit outputs a DC signal based on the peak value, and the sense amplifier circuit reads the data using the DC signal.

29. The system according to claim 24, wherein the memory cell includes a variable resistance element.

30. The system according to claim 24, wherein the memory cell includes a magnetoresistive effect element.

* * * * *